(12) United States Patent
Smith

(10) Patent No.: US 7,345,735 B2
(45) Date of Patent: Mar. 18, 2008

(54) APPARATUS FOR ABERRATION DETECTION AND MEASUREMENT

(76) Inventor: Bruce W. Smith, 22 Mt. Eagle Dr., Penfield, NY (US) 14526

( * ) Notice: Subject to any disclaimer, the term of this patent is extended or adjusted under 35 U.S.C. 154(b) by 0 days.

(21) Appl. No.: 11/527,911

(22) Filed: Sep. 27, 2006

(65) Prior Publication Data

US 2007/0019171 A1    Jan. 25, 2007

Related U.S. Application Data

(62) Division of application No. 10/734,462, filed on Dec. 12, 2003, now Pat. No. 7,136,143.

(60) Provisional application No. 60/433,153, filed on Dec. 13, 2002.

(51) Int. Cl.
*G03B 27/68* (2006.01)
*G03B 27/52* (2006.01)
*G03B 27/42* (2006.01)

(52) U.S. Cl. .............................. 355/52; 355/40; 355/53

(58) Field of Classification Search ............ 355/52–53, 355/55, 71, 67, 40; 430/5, 20, 22; 438/401; 378/5; 356/2; 436/401
See application file for complete search history.

(56) References Cited

U.S. PATENT DOCUMENTS

| | | | |
|---|---|---|---|
| 4,641,962 A | 2/1987 | Sueda | |
| 5,367,404 A | 11/1994 | Hayata | |
| 5,828,455 A | 10/1998 | Smith | |
| 5,978,085 A | 11/1999 | Smith | |
| 6,248,486 B1 | 6/2001 | Dirksen | |
| 6,368,763 B2 | 4/2002 | Dirksen | |
| 6,552,776 B1 | 4/2003 | Wristers et al. | |
| 6,839,132 B2 | 1/2005 | Fukuhara et al. | |
| 2002/0088951 A1 | 7/2002 | Chen | |
| 2003/0091913 A1 | 5/2003 | Shiode | |
| 2003/0098970 A1 | 5/2003 | Chen | |
| 2003/0147061 A1 | 8/2003 | Omura | |
| 2003/0203319 A1 | 10/2003 | Lee | |
| 2003/0211700 A1* | 11/2003 | Leung et al. | ............ 438/401 |

FOREIGN PATENT DOCUMENTS

JP    2000-146758 A    5/2000

\* cited by examiner

*Primary Examiner*—Peter B. Kim
(74) *Attorney, Agent, or Firm*—Hiscock & Barclay, LLP

(57) ABSTRACT

Aberrations in an optical system can be detected and measured using a method comprised of a test target in the object plane of a projection system and imaging a photoresist film with the system. The test target comprises at least one open figure which comprises a multiple component array of phase zones, where the multiple zones are arranged within the open figure so that their response to lens aberration is interrelated and the zones respond uniquely to specific aberrations depending on their location within the figure. This is a unique and new method of detecting a variety of aberration types including coma, spherical, astigmatism, and three-point through the exposure of a photoresist material placed in the image plane of the system and the evaluation of these images.

17 Claims, 22 Drawing Sheets a b c d

-3rd order astigmatism

Focus +/- 0.12 μm

+3rd order astigmatism

Focus +/- 0.12 μm

+3rd order 45° astigmatism
Focus +/- 0.12 μm

-3rd order 45° astigmatism

Focus +/- 0.12 μm

−3$^{rd}$ order spherical

Focus −0.16 −0.12 +0.12 +0.16 μm

+3$^{rd}$ order spherical

Focus −0.16 −0.12 +0.12 +0.16 μm

APPARATUS FOR ABERRATION DETECTION AND MEASUREMENT

CROSS REFERENCE TO RELATED APPLICATIONS

This application is a Divisional of U.S. patent application Ser. No. 10/734,462 filed Dec. 12, 2003, now U.S. Pat. No. 7,136,143, which claims the benefit of the priority date of U.S. Provisional Patent Application Ser. No. 60/433,153 filed Dec. 13, 2002.

FIELD OF THE INVENTION

The present invention relates to microlithographic imaging using a projection exposure system for fabricating semiconductor devices and the detection of aberrations in the system

BACKGROUND OF THE INVENTION

Optical lithography has been the dominant technology for the patterning of semiconductor device features. As the size of the geometry for these devices continue to shrink below the ultraviolet (UV) wavelength used for imaging, significant demands are placed on the quality of the optical component within the projection imaging system. The projection system used for imaging of sub-wavelength features coprise a large number of lens elements and operate at wavelengths ranging from 436 nm to 126 nm. The level of aberration in these systems must be low enough to allow imaging on the order of 0.30 lambda/NA, where lambda is the imaging wavelength and NA is the numerical aperaturte of the lens system, typically on the order of 0.40 to 0.90. This type of performance is near the physical limits of diffraction and aberrations must be low enough to produce optical wavefront deformation in the projection lens pupil below a multiple of 0.1 wavelengths, and approaching 0.01 wavelengths for the most current systems.

Lens quality can be described in terms of the ability of an optical system to convert the spherical wavefront emerging from an object point into a spherical wavefront converging toward an image point. Each aberration type will produce unique deviations in the wavefront within the lens pupil.

For a system utilizing full circular pupils, Zemike circle polynomials can be used to $$W(\rho, \theta) \sum_{n=0}^{\infty} \sum_{m=0}^{n} \sqrt{2(n+1)/(1+\delta_{m0})}\, R_n^m(\rho)[c_{nm}\cos(m\theta) + s_{nm}\sin(m\theta)]$$

represent optimally balanced classical aberrations. Any term in the expansion of the wave aberration function leading to a complete set of Zemike polynomials can be represented as: where n and m are positive integers (n−m≧0 and even), $c_{nm}$ and $s_{nm}$ are aberration coefficients, and the radial polynomial R of degree n in terms of the normalized radial coordinate in the pupil plane (ρ) is in Mahajan's convention [V. N. Mahajan, Zernike circular polynomials and optical aberrations of systems with circular pupils, Eng. and Lab Notes, in Opt. & Phot. News 5,8 (1994)]. Commonly, a set of 37 Zernike polynomial coefficients is utilized to describe primary and higher order aberration, although some applications may require additional terms.

Since any amount of aberration results in image degradation, tolerance levels must be established for lens system, dependent on application. This results in the need to consider not only specific object requirements and illumination but also process requirements. Conventionally, an acceptably diffraction limited lens is one which produces no more than one quarter wavelength (λ/4) wavefront OPD. For many non-lithographic lens systems, the reduced performance resulting from this level of aberration may be allowable. This Rayleigh λ/4 rule is not suitable however for microlithographic applications. To establish allowable levels of aberration tolerances for a photolithographic application, application specific analysis must be performed. Photoresist requirements need to be considered along with process specifications. The current needs of UV and DUV lithography require a balanced aberration level below 0.03λ OPD RMS. Future requirements may dictate sub-0.02λ performance. More important, however, may not be the full pupil performance but instead the performance over the utilized portion of the pupil for specific imaging situations [B. W. Smith, Variations to the influence of lens aberration invoked with PSM and OAI, Proc. SPIE 3679 (1999)]. For a good review of lithographic requirements and tolerances, also see [D. Williamson, The Elusive Diffraction Limit, OSA Proceedings on Extreme UV Lithography (1994), 69].

Aberration metrology is critical to the production of lithographic quality lenses in order to meet these strict requirements. Additionally, it is becoming increasingly important to be able to measure and monitor lens performance in an IC fabrication environment. The lithographer needs to understand the influences of aberration on imaging and any changes that may occur in the aberration performance of the lens between lens assembly and application or over the course of using an exposure tool.

The most accurate method of measuring wavefront aberration (and subsequently fitting coefficients of Zernike polynomials) is phase measurement interferometry (PMI), also known as phase shifting interferometry (PSI) [J. E. Greivenkamp and J. H. Bruning, Optical Shop Testing: Phase Shifting Interferometry, D. Malacara ed, (1992) 501]. PMI generally describes both data collection and the analysis methods that have been highly developed for lens fabrication and assembly and used by all major lithographic lens suppliers. The concept behind PMI is that a time-varying phase shift is introduced between a reference wavefront and a test wavefront in an interferometer. At each measurement point, a time-varying signal is produced in an interferogram. The relative phase difference between the two wavefronts at this position is encoded within these signals.

The accuracy of PMI methods lies in the ability to sample a wavefront. A wavefront can be sampled with a spacing of λ/n where n is the number of times the system is traversed by a test beam. These methods require careful control of turbulence and vibration. A more significant limitation of these interferometric methods in the need for the reference and test beams to follow separated paths, making field use (or in-situ application) difficult. The lithographer is therefore restricted to using alternative approaches to measure, predict, approximate, or monitor lens performance and aberration.

Methods of Aberration Measurement

In addition to interferometric techniques, several methods have been developed and utilized to test and/or measure optical performance.

Common-Path Interferometry (and the PSPD Method)

In a conventional interferometer (such as a Twyman-Green or Mac-Zehnder used with PMI), test and reference beams must follow separate paths. This is the main difficulty with employing these methods for in-situ measurement on a lithography tool. Common path interferometry is possible where a reference beam travels a path through the test optic but is done in such a way that it either does not experience aberration or system aberrations are removed. This approach was first carried out by Burch [J. M. Burch, "Scatter Fringes of Equal Thickness", *Nature*, 171 (1953) 889] and has recently been applied for lithographic purposes. Workers at Lawrence Berkeley laboratories have developed Phase Shifting Point Diffraction (PSPD) interferometry to measure the quality of EUV optical systems on the order of 0.02 waves RMS [P. Naulleau et al, Proc. SPIE 3331 (1998) 114]. The method utilizes a transmission grating to produce test and reference diffraction beams. The zero diffraction order beam is directed through the optic being tested and experiences aberration present within the lens pupil. A higher grating diffraction order beam is directed toward the edge of the lens pupil and is directed through a small pinhole at the image side of the optic. If the pinhole is perfect, any aberration in this beam is removed. The test beam and the reference beam are interfered and sampled for various grating positions to reconstruct the pupil wavefront phase. Algorithms used for this approach are similar to those used for PMI techniques. RIT has also utilized this method at UV and DUV wavelengths [P. Venkataraman, B. Smith, *Study of aberrations in steppers using PSPD interferometry*, Proc. SPIE 4000 (2000)]. The two primary sources of error with these methods are systematic geometric effects that arise from the geometry of the system (which can be compensated for if measurable) and imperfections in the pinhole. Pinhole imperfections result in reference beam (and reference wave) error dependant on the size, shape, and positioning of the pinhole. There is a real limitation to the fluence that can pass though a pinhole and the fabrication capabilities required to make such an artifact. Additionally, since interferograms must be detected beyond the image plane, a system under test must allow access at these positions. Large numerical apertures will also make image capture difficult and secondary optical relay systems may be required. Although PSPD methods have a good deal of potential for accurate wavefront measurement, implementation will likely be difficult without modifications to stepper or scanner hardware.

Foucault Knife Edge and Wire Tests

Foucault first introduced a knife edge test, which has been modified by several workers and applied to many optical systems [L. M. Foucault, Ann. Obs. Imp. Paris, 5, 197 (1859)]. By blocking out part of a plane within a lens system traversed by diffracted light, a shadow can be formed over aberrated pupil regions. The behavior of the shadow pattern can be correlated to aberration, especially spherical, defocus, coma, and field curvature. Various enhancements to this approach have proven capability at the levels needed for microlithography application but implementation may be difficult. Mechanical slits and knife-edges (or a wire in a similar test procedure) must be placed within the optical system with tight tolerance over placement and parallelism.

A major limitation to these types of tests is that the test is insensitive to small wavefront slope changes, in terms of either magnitude or direction. In other words, when the first or second derivatives of the wavefront errors are small, these tests are quite insensitive. This is especially problematic with large apertures.

Star Tests

Probably the most basic method to test for image quality is a star test. Approaches like these examine the image of a point source and compare image quality to an ideal. Some of the most useful comparative information dates back to Taylor (H. Taylor, *The Adjustment and Testing of Telescope Objectives* (1891)]. Airy patterns (point spread functions) are unique for each aberration type and aberration levels to 0.05 waves have been measured by evaluation of confined energy and intensity contours of images. Star tests can be inherently quite qualitative and a good deal of experience is required to adequately describe an aberrated wavefront.

Star tests have been used for final rapid adjustment to balance spherical aberration in microscope objectives. By viewing images of pinholes, an experienced user can quickly assess aberration level. The problem with this method is its qualitative aspect. Application to lithography may be useful for assessment purposes only. This may prove difficult, however, since diffraction limited pinhole images would be difficult to record with any detail in photoresist.

Ronchi Tests

The Ronchi test for optical system performance has historically been used also in a mostly qualitative way [see for instance A. Corejo-Rodriquez, Ronchi Test, Optical Shop Testing: Phase Shifting Interferometry, D. Malacara ed, (1992) 321]. The principle of the approach is realized when a ruling is placed near the center of curvature of a mirror, where the image of the grating is superimposed on the grating itself, producing an interference pattern. This approach has been used for many applications since Ronchi first introduced it in 1923 [V. Ronchi, Riv. Ottica Mecc. Precis., 2, 9 (1923)]. Techniques employing Ronchi principles have allowed for wavefront measurement and fitting of primary and higher order aberration to a high degree of accuracy. These methods are limited, however, by the requirement of a reflective optical system. Practical application for microlithographic purposes is therefore also limited.

Blazed Grating Methods

Kirk and Progler have introduced a method to measure wavefront aberration using a phase grating reticle to direct diffraction orders to particular portions of a lens pupil [J. P. Kirk and C. J. Progler, Proc. SPIE 3679 (1999) 70]. These blazed gratings are oriented at various angles (for example 0 to 337.5 degrees at 22.5 degree increments). The image of the grating is stepped through focus and imaged into photoresist. A second blanket exposure is made, resulting in a composite aerial image formed in a near linear response portion of the photoresist material. The resulting images contain aberration information for the portion of the lens pupil sampled by the diffraction energy directed at the blazed angle (or frequency). By using several grating angles (frequencies), both low and high order aberration terms can be fitted. Algorithms have been developed to fit this information from measured resist images. As with many resist based evaluation methods, the capability of this approach requires matching the images recorded in resist to simulation with various aberration type. This approach is not limited to symmetrical aberration types because of the distribution of gratings over a wide range of orientations. The main concern with this method is the ability to match high order azimuthal aberration effects. The capability of the blazed grating approach increases with increasing grating frequencies present on the test reticle. Fabrication of this reticle becomes challenging then as a range of etch angles must be accommodated. Accuracy of this method has been reported to be within 12% for a single grating frequency. Improvements are possible using additional grating frequencies and by using lower values of partial coherence. By using partial coherence values approaching coherent illumination, the averaging effect imparted on diffraction orders is reduced. This becomes challenging with current exposure tools that limit sigma to values above 0.3. Lower values will result in significant loss in image intensity. Careful characterization of the photoresist material is also required for this method. Ideally, a resist should be of low contrast and highly absorbing (in a photochemical sense). This implies that the resists used for IC fabrication would not be well suited and special materials and modifications to processes would most likely be required.

Aerial Image Measurement

Direct aerial image measurement has been carried out for optical systems for many applications. The basic concept of this idea is that measurement of the output response function of a system for a specific input can lead to characterization of error mechanisms. The approach that is best utilized is one that could measure the spread function from a point or a line (commonly known as point spread function and line spread functions respectively). For a linear, locally-stationary system, the Fourier Transform of these functions will lead to a modulation transfer function, which. This is challenging for partially coherent imaging but correlation approaches exist. Two difficulties arise with this method of image assessment for optical lithography. First is the problem with the separating of aberration types and understanding their contribution to losses in the spread or transfer functions. Small levels of aberration can have similar impact and identification of azimuthal orders will be difficult. The second set of challenges with this method comes with making the mask and detector artifacts that are small enough to give the resolution required for images of interest, accurately producing arrays of these features at the detector, and getting sufficient energy though a small "pinhole" or slit feature. An approach to this technique has been described by workers a Bell Labs and U. C. Berkeley [E. L. Raab et al, Proc. SPIE 2197 (1994) 550].

Wavefront Estimation Through Masking and Illumination

Several workers have developed and demonstrated in-situ methods to infer lens aberration and wavefront shape through use of particular mask features. One technique that has matured to a reasonable commercial level is the phase shift focus monitor test developed by IBM [T. Brunner et al, Proc. SPIE 2197 (1994) 541]. Through the use of techniques similar to those used with phase shift masking approaches, aberrations can be estimated from image and focus shifts. This method of measurement leads to an estimation based on knowledge of how a particular aberration should influence a particular image. The phase shift focus monitor approach is very useful for fitting low order aberration but discrimination over a given azimuthal term is difficult. It is expected that a good deal of work will continue in this area, allowing the lithographer to get a better understanding of the performance of a lithography tool. Test methods can be developed to measure specific portions of a wavefront. Complete description of an aberrated wavefront is difficult.

Other methods of pupil sampling can be used to measure particular portions of a wavefront. With the use of any resolution enhancement technique (RET) such as phase shift masking (PSM) or off-axis illumination (OAI), particular potions of a pupil are utilized, leading to a more discrete sampling of a wavefront than would occur with conventional partially coherent illumination. This can be taken advantage of by designing illumination or phase masking that resonates with particular aberrations. As an example, an alternating phase shift mask structure can be quite sensitive to astigmatism and 3-point. The images of such features are then measured and compared with simulated images using known levels of aberration. The accuracy of matching an aberrated wavefront using this type of estimation is increased by including a range of different conditions and by limiting evaluation to those conditions that would most likely be experience in a real imaging situation. A method of wavefront sampling using binary line mask structures is also describe in EP0849638, where the amount of aberration is determined on the basis of a difference between line widths. This method is adequate for the detection of comatic aberration but it is difficult to extract the magnitude of such aberrations or the presence of other aberrations.

Hartmann and Other Screen Tests

Perforated screen methods were first devised to eliminate the sensitivities associated with interferometric methods used for wavefront measurement, most specifically air turbulence. A good review is contained in [I. Ghozeil, Optical Shop Testing: Hartmann and Other Screen Tests, D. Malacara ed, (1992) 501]. The basic concept of a screen test is that a wavefront can be sampled at a number of locations across a pupil in a predetermined fashion, allowing for reconstruction by relating these sampled points to one another. The use of a portion of a wavefront creates a focus position that is not coincidental with the ideal focus of an entire wavefront. A tilt term results, which can be calculated based on the geometry of the optic being tested. Using this approach, any tilt aberration in the lens can be measured as a deviation form this predicted result. Using a number of sampling points, wavefront aberrations can be mapped. Sampling screens of various types have been devised over the years. Hartmann first described a radial screen [J. Hartmann, Zt. Instrumentenkd., 24, 1 (1904)], which had been most common until the square array screen tests suggested first by Shack and employed by various workers. Radial screens have been used for testing large concave mirrors, especially for telescopes. The advantage of the square array is the removal of circular symmetry, and the assumptions that can lead to artifact circular error buildup. A much higher surface sampling can also be obtained. Also, the fabrication and measurement of a rigid square array screen can ensure accuracy of wavefront metrology. One problem screen type methods inherently possess is the inability to detect small scale surface changes taking place between the holes in the screen. These tests are often combined with other techniques to improve capability.

Additional challenges encountered with screen tests include methods of data collection and data reduction. The use of electro-optical detector arrays has been described for data collection [E. T. Pearson, Proc. SPIE 1236, 628 (1990)], which is commonly performed using photographic plates. Rapid data collection is permitted and averaging is permitted. An additional improvement with the use of an electro-optical detector is an interferometric capability that can be included by intentionally overlapping sampling spots. This can allow closer packing of sampling spots and can lead to higher accuracy across the pupil. An additional advantage of such a detector is the ability to filter low intensity noise artifacts.

The Hartman test has been improved upon and has found its way into microlithographic applications. Through use of rigid screens with precise control over placement and tilt, measurement of projection lens wavefront is possible. The application of Fourier transform methods of data analysis [describe for instance by F. Roddier, Soc. Photo-Opt. Eng., 1237, 70 (1990)] assists with automation and the handling of large amounts of data. Canon has disclosed a variation to the Hartmann test [U.S. Pat. No. 4,641,962 (1987)] for measuring wavefront aberration of a test optic in a reverse projection scheme. This test technique is not described for use in-situ in a projection system but is indicative of the developments that have been made with Hartmann type tests for modern lens metrology.

A method referred to as the Litel method ([U.S. Pat. No. 5,978,085 and U.S. Pat. No. 5,828,455) uses a reticle consisting of a multiplicity of small openings. The method is a variation of a square array Hartmann screen test, often referred to as a Shack-Hartmann screen test. Several reviews have been published on this technology, [N. Farrar et al, Proc. SPIE 4000 (2000)]. The advantage of placing the screen at the reticle plane is in the positional accuracy that can be obtained in current microlithographic tools. Placing the screen at this position in the optical train requires additional optical components to be incorporated into the imaging system, which are added to the reticle instrument. A fundamental problem with screen tests is the inability to test wavefront positions between those tested with the screen openings Phase Contrast Tests Zernike first proposed using an improvement to the Foucault test, which has become known as a phase contrast or phase modulation test [F. Zernike, Mon. Not. R. Astron. Soc., 94, 371 (1934)]. This technique (and others also developed by many workers since) uses a phase shifted disk artifact in the optical path so that the resulting phase delay is recorded and can be correlated to wavefront aberration. Wolter developed a $\lambda/2$ phase edge test, which is considered a variation of the knife edge or wire test where the phase edge removes the need to use a physical method to block light [H. Wolter, Handbook of Physics, Vol. 24, Springer-Verlag, Berlin (1956), 582]. This improvement has become interesting for applications requiring in-situ measurement.

The most recent modification to a phase contrast testing method (similar to the Wolter test) is the DART (Dirkson Annular Ring Test) method developed by Dirkson [P. Dirkson et al, Proc. SPIE 3679 (1999) 77] and described in U.S. Pat. No. 6,248,486 and U.S. Pat. No. 6,368,763. The DART method employs a test object which comprises a single closed figure having a phase structure. The closed phase object is generally sized in the reticle plane with diameter $\sim\lambda/NA$ and a phase of $\lambda/2$. The image of this phase edge ring is printed into resist. The cross section of the ring is a convolution of the point spread function of the imaging tool at the particular condition of illumination with the resist response function. The image is scanned using a detection device such a scanning electron microscope (SEM). The scanned image is then subjected to analysis to ascertain lens aberration. The ring image allows for evaluation of wavefront aberration at various azimuthal (angular) positions. Calibration and correlation of this ring image to wavefront aberration involves the deconvolving of the resist function and fitting algorithms to extract primary and higher aberration terms.

The degree to which this type of method can estimate an aberrated wavefront depends on the portions of the lens pupil that are used to create the measured image. Maximum sensitivity will be obtained using this method at low sigma levels. As partial coherence is decreased, however, less of the full lens pupil is utilized to image the phase edge and correlation to full wavefront information is difficult. It has been suggested that sampling over a range of illumination conditions can improve the estimation. This complicates the process to some degree by requiring multiple exposure and measurement passes. The extraction and interpretation of aberrations from the images is often difficult and time consuming because of the often subtle shape deformation that is introduced into the ring images with low and moderate levels of aberration. Large amounts of data are often needed for conclusive results. Consequently, the method is often only practiced by individuals that are well trained in the fitting and interpretation of the ring image results.

SUMMARY OF THE INVENTION

An object of this invention is to provide a convenient method for the detection of lens aberration that can be employed during the standard operation of a projection system, that is through the exposure of a photoresist coated substrate through illumination of a mask test target using a radiation source and an illumination apparatus. Furthermore, the method of the invention allows for the detection of specific aberration types and trends, as well as levels of aberration, though visual inspection of high resolution images of resist patterned as well as through the fitting of aberration parameters through the means of mathematical analysis of images and fitting algorithms. The test method comprises a test target which comprises at least one open figure which comprises a multiple component array of phase zones, where the muliple zones are arranged within the open figure so that their reponse to lens aberration is interrelated and the zones respond uniquely to specific aberrations depending on their location wihin the figure. This is a unique and new method of detecting a variety of aberration types including coma, spherical, astigmatism, and three-point through the exposure of a photoresist material placed in the image plane of the system and the evaluation of these images. The test method offers the advantage over other methods because of the sensitivity to particular abberation types, the unique response of multiple zones of the test target to aberrations, and the ease with which aberrations can be distinguished. An open figure of the test target refers to a figure having no single contour line to close the figure, providing no boundary line between the figure and the surrounding area. The method of lens aberration detection is based on the identification of the deviations that occur between the images printed with the open figure test target and images that would be produced in the absence of aberration. This can be carried out for example through the use of lithography simulation, where simulated images can be produced without aberration and with various levels of lens aberration. Comparisons of printed resist images to simulated resist images are made while the values of the coefficients for primary Zernike aberrations are varied.

The interrelationship among the multiple phase geometry is unique to this invention and allows detection of aberration using the open figure test target that is not possible through the use of a target that consists of single closed figures, as described in U.S. Pat. No. 6,248,486. Also, the detection of aberration that is made possible through the test object of the present invention is not possible using a test object consisting of structures defined only in amplitude, as described in Chen in Pub. No. US2002/0088951.

The method of this invention is rejected in U.S. Pat. No. 6,248,486, the disclosure of which is incorporated herein by reference, and which describes a closed single figure. The method of this invention is also rejected in Pub. No. US2002/0088951 where a plurality of non-resolvable amplitude-only features is arranged as a test target and the circumstances associated with the use of phase patterns is described as problematic. It is proposed that the non-resolvable amplitude-only features are used to approximate the imaging effects of the closed single figure of U.S. Pat. No. 6,248,486. The method of the present invention is not obvious based on the disclosures of prior art. The response of the test object of the present invention to lens aberration that is interrelated where the zones respond uniquely to specific aberrations depending on their location within the figure cannot be described, predicted, or ascertained by the previous disclosures.

DETAILED DESCRIPTION OF THE INVENTION

Figure 1:
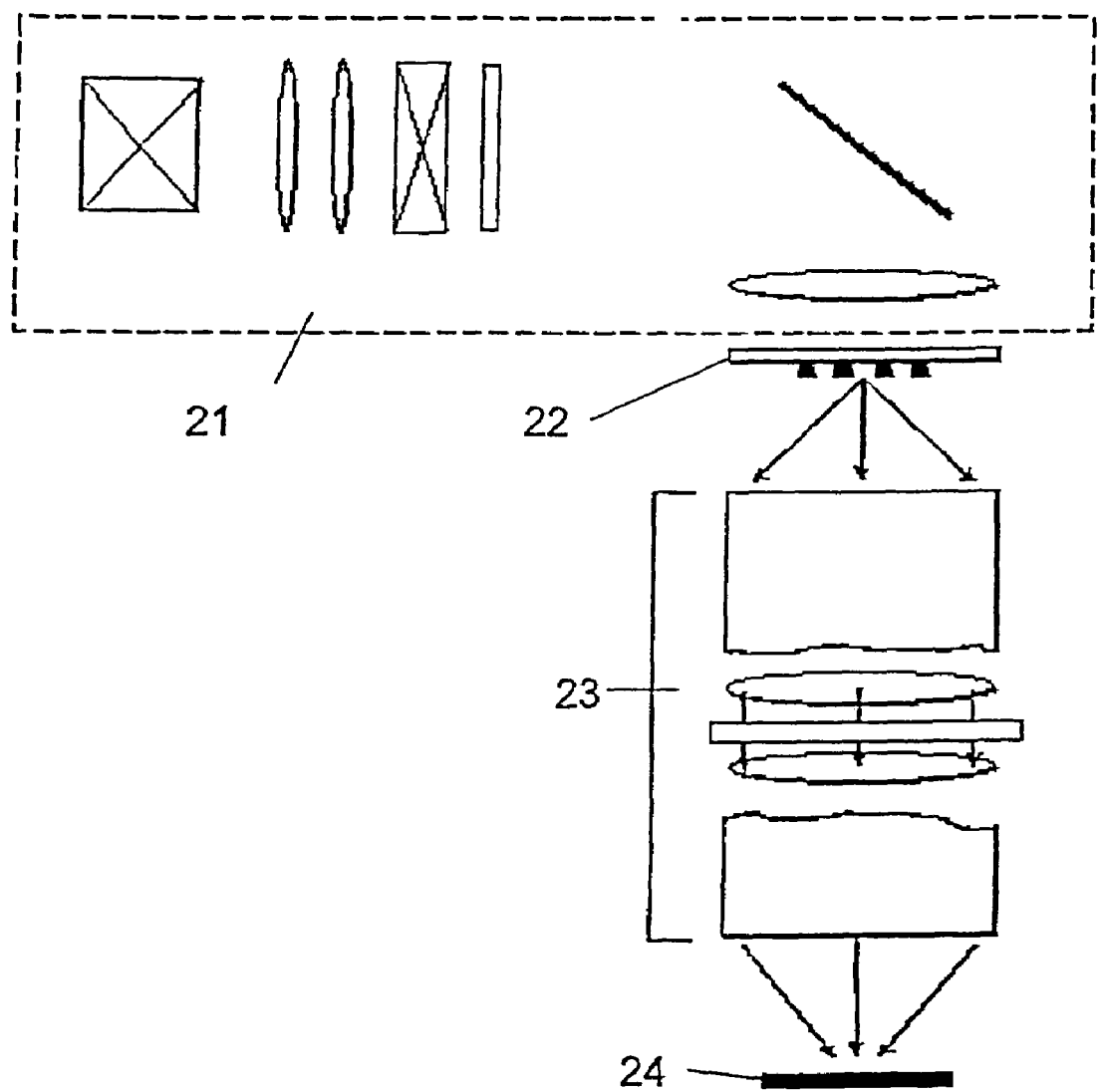
FIG. 1 is a schematic of a projection imaging system that would employ an embodiment of the method of the invention.
Figure 2:
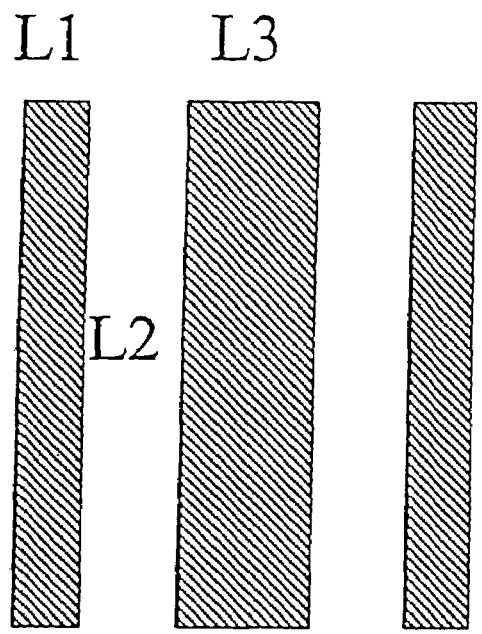
FIG. 2 is an x-oriented open multiple phase bar test object and its image in a photoresist.
Figure 2:
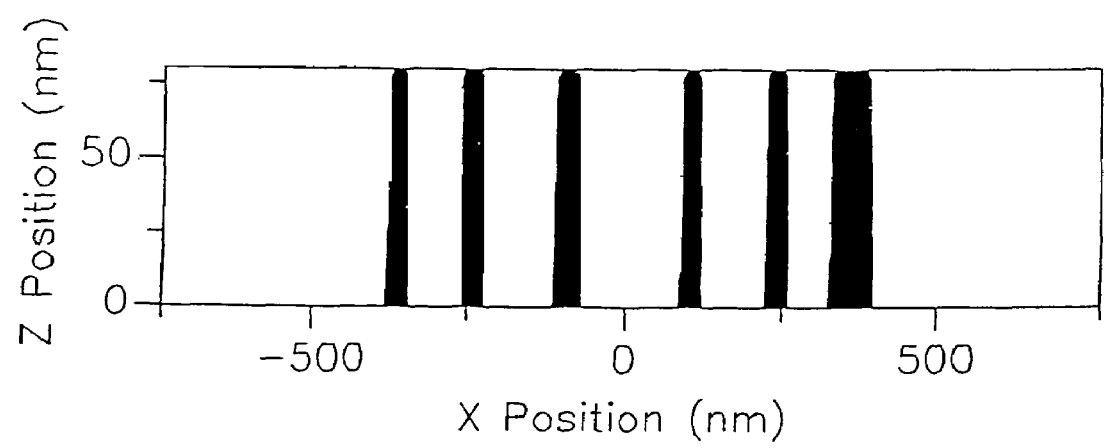
Figure 3:
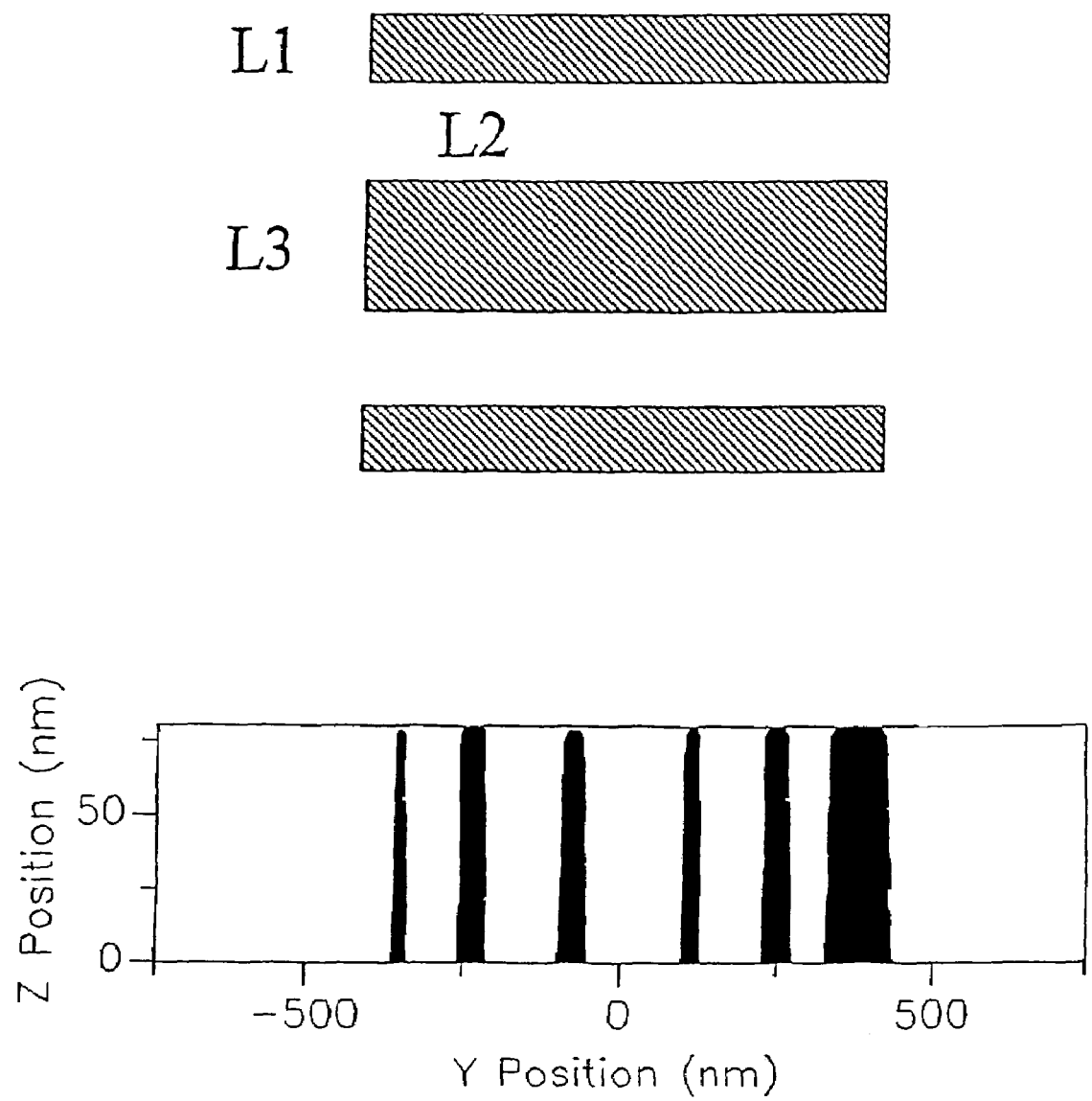
FIG. 3 is a y-oriented open multiple phase bar test object and its image in a photoresist.
Figure 4:
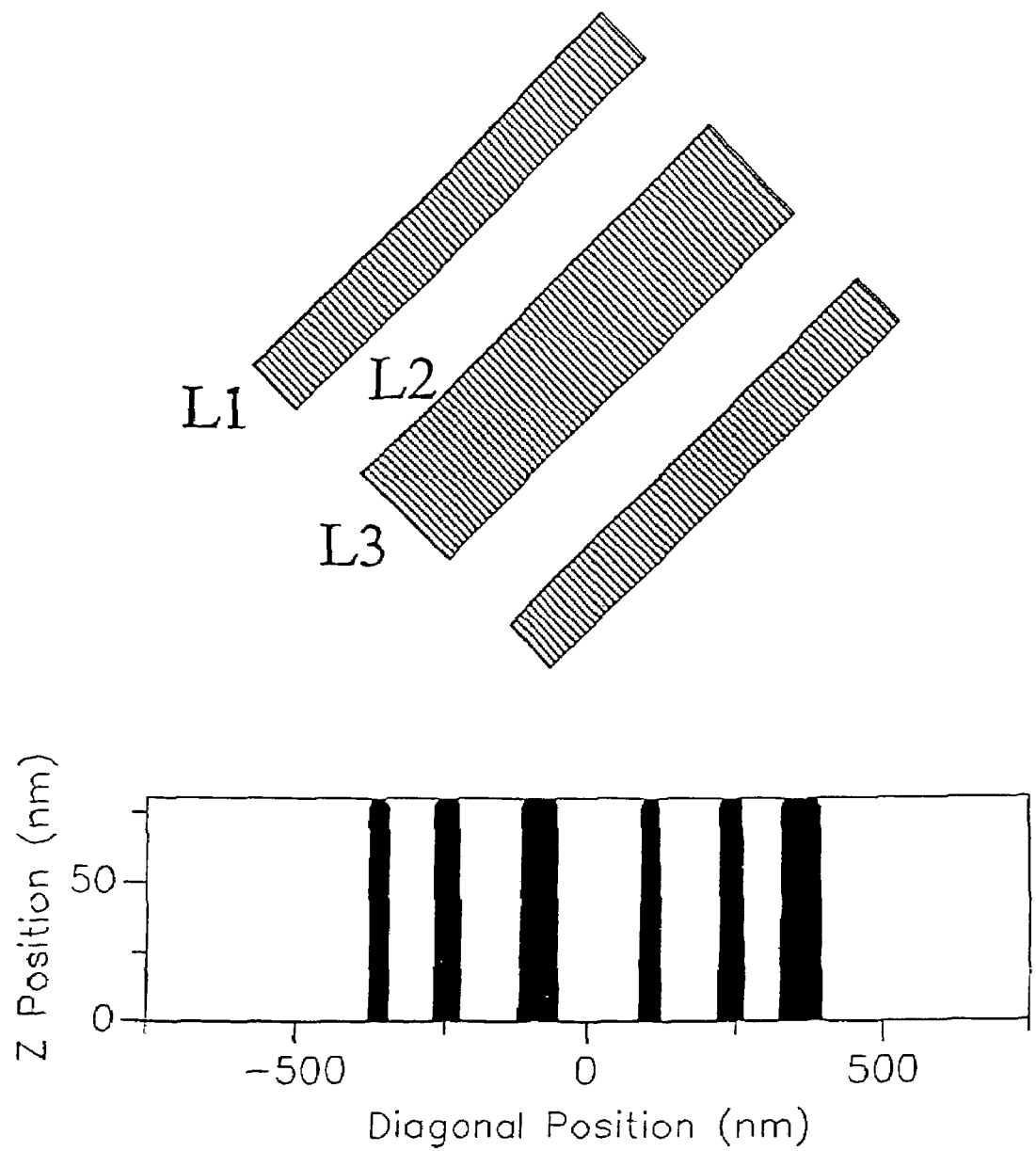
FIG. 4 is an open multiple phase bar test object oriented at 45 degrees and its image in a photoresist.
Figure 5:
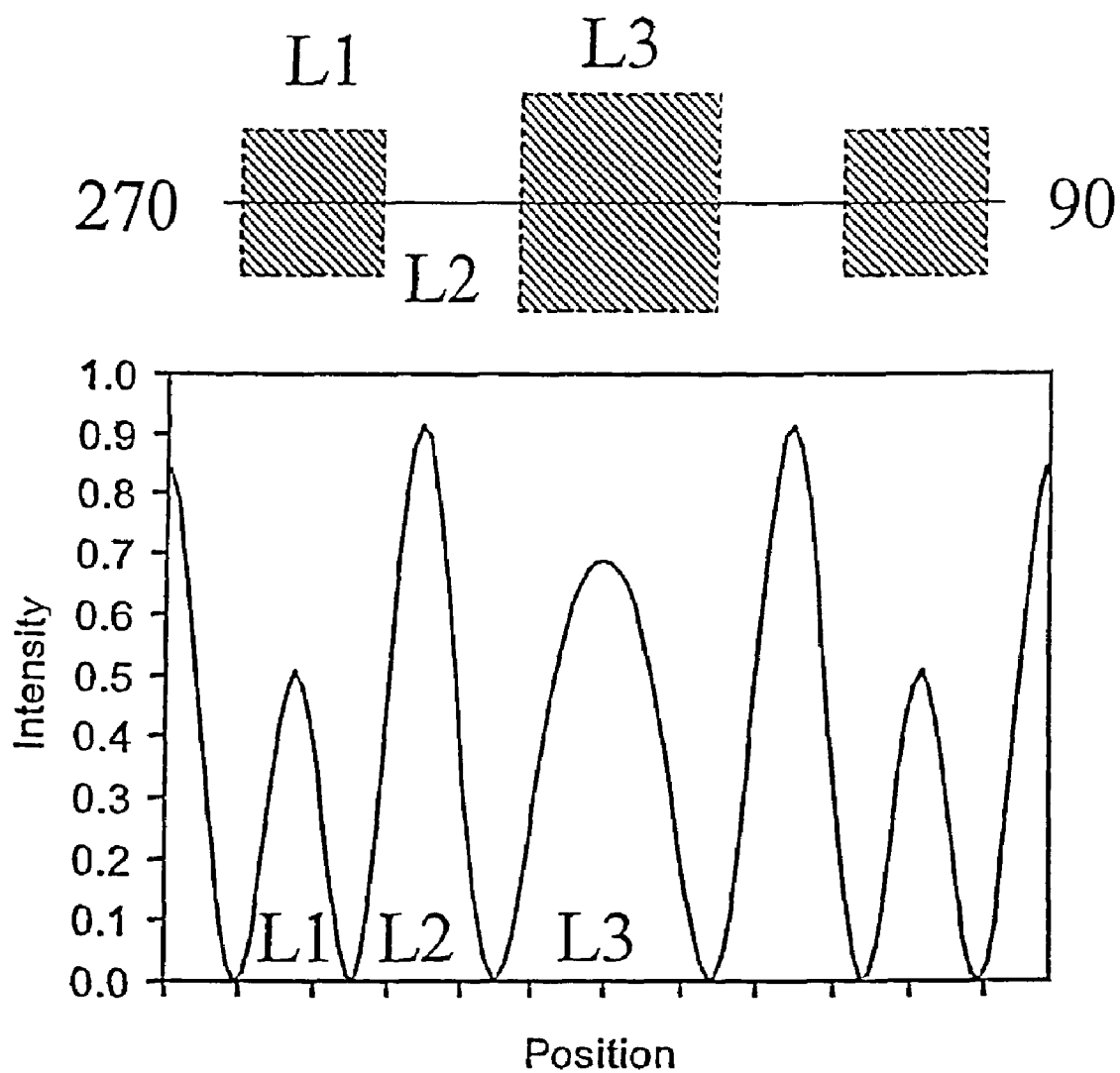
FIG. 5 is a multiple open phase box test object and its intensity image.
Figure 6:
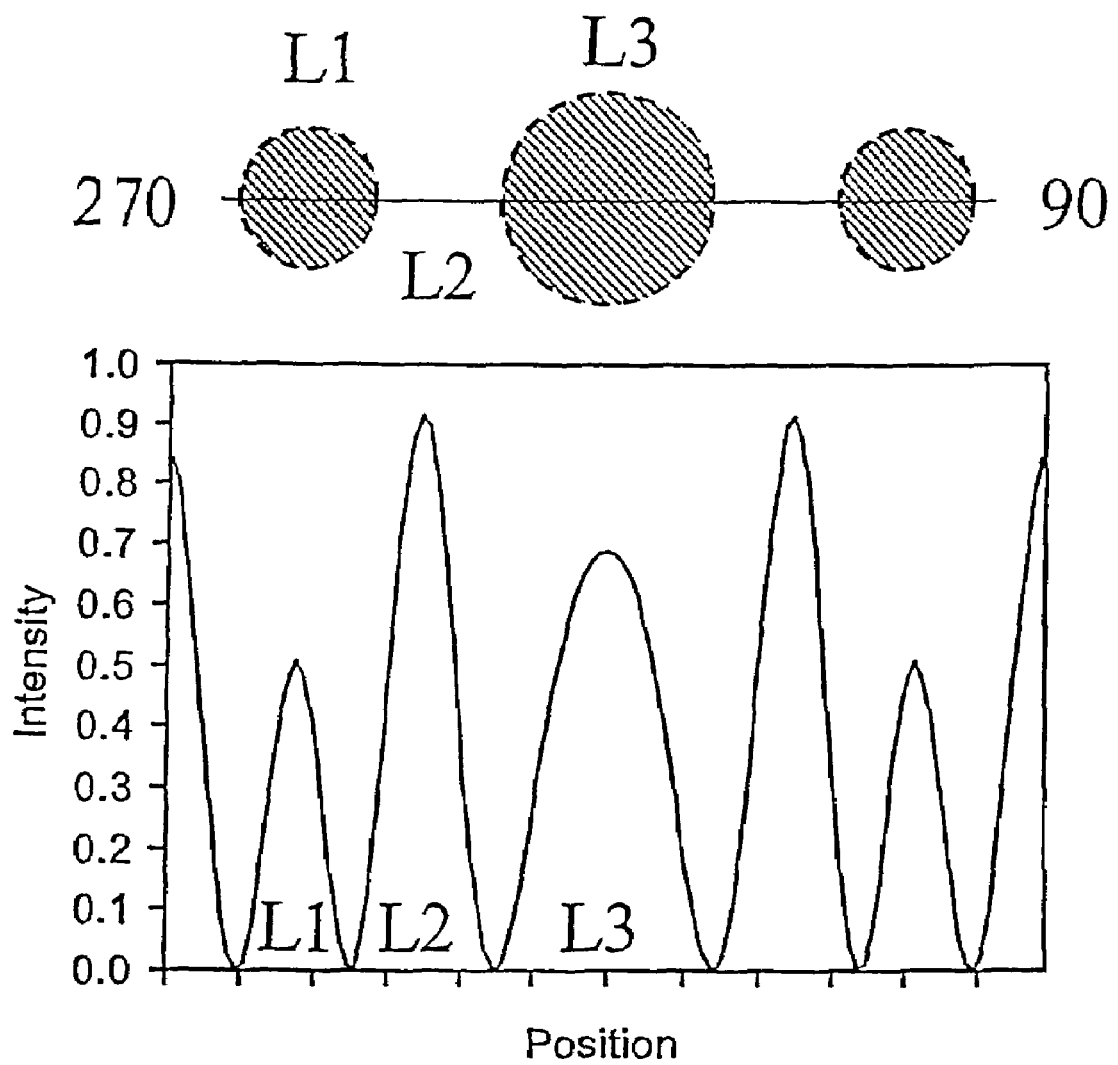
FIG. 6 is a multiple open phase circle test object and its intensity image.

When imaging with a projection optical system, the aberrations in the lens pupil introduce deformation to a wavefront resulting in imaging errors. FIG. 1 shows a schematic of a projection imaging system. An illumination apparatus 21 illuminates a mask test object 22 which is imaged through an objective lens 23 onto a photosensitized substrate 24. If a test object is employed on a photomask as a phase pattern, specifically with a phase shifted from that of the surrounding area by 180 degrees, the lens aberration will introduce imaging errors characteristic of the aberration type and the mask geometry. As an example, FIG. 2 shows how three small phase lines (between 0.5 and 1.5 lambda/NA) are printed into a photoresist. The images are a result of lithographic simulation using a Prolith vector model (Prolith Version 7.0, KLA FINLE) with a wavelength of 157 nm, a numerical aperture (NA) of 0.85, a partial coherence value of 0.30, and a resist thickness of 80 nm. The resulting image consists of six separate lines, each occurring at the phase transitions on the photomask. The differences between the six lines are a result of the random aberration programmed into the simulator at a level corresponding to a root mean square (RMS) of 0.03 waves (a reasonable level for such a lithography system). FIG. 3 shows the effects of rotating the test object by 90 degrees, resulting in a different and unique effect to the resulting six lines, which is indicative of the radial and angular dependence of aberrations within the lens. FIG. 4 shows the effects of rotating the test object by 45 degrees where results are also unique. It is desirable to detect aberration effects at all orientations or directions simultaneously. The test phase objects of FIGS. 2 through 4 can be reduced from multiple line groupings to multiple phase box groupings, as shown in FIG. 5. This figure shows how the image intensity through the center the three boxes of sizes L1 and L3 spaced distance L2 apart and oriented along a 90-270 degree axis results in six dark regions, or lines, in a clear field, similar the effect for the three bar patterns in earlier figures. The separation of the three dark regions is determined by the L1, L2, and L3 dimensions. Furthermore, the shape of the phase features within the test target need not be square. FIG. 6 shows how circular phase shapes produce similar intensity profiles along a central region of a multiple pattern grouping.

Figure 7:
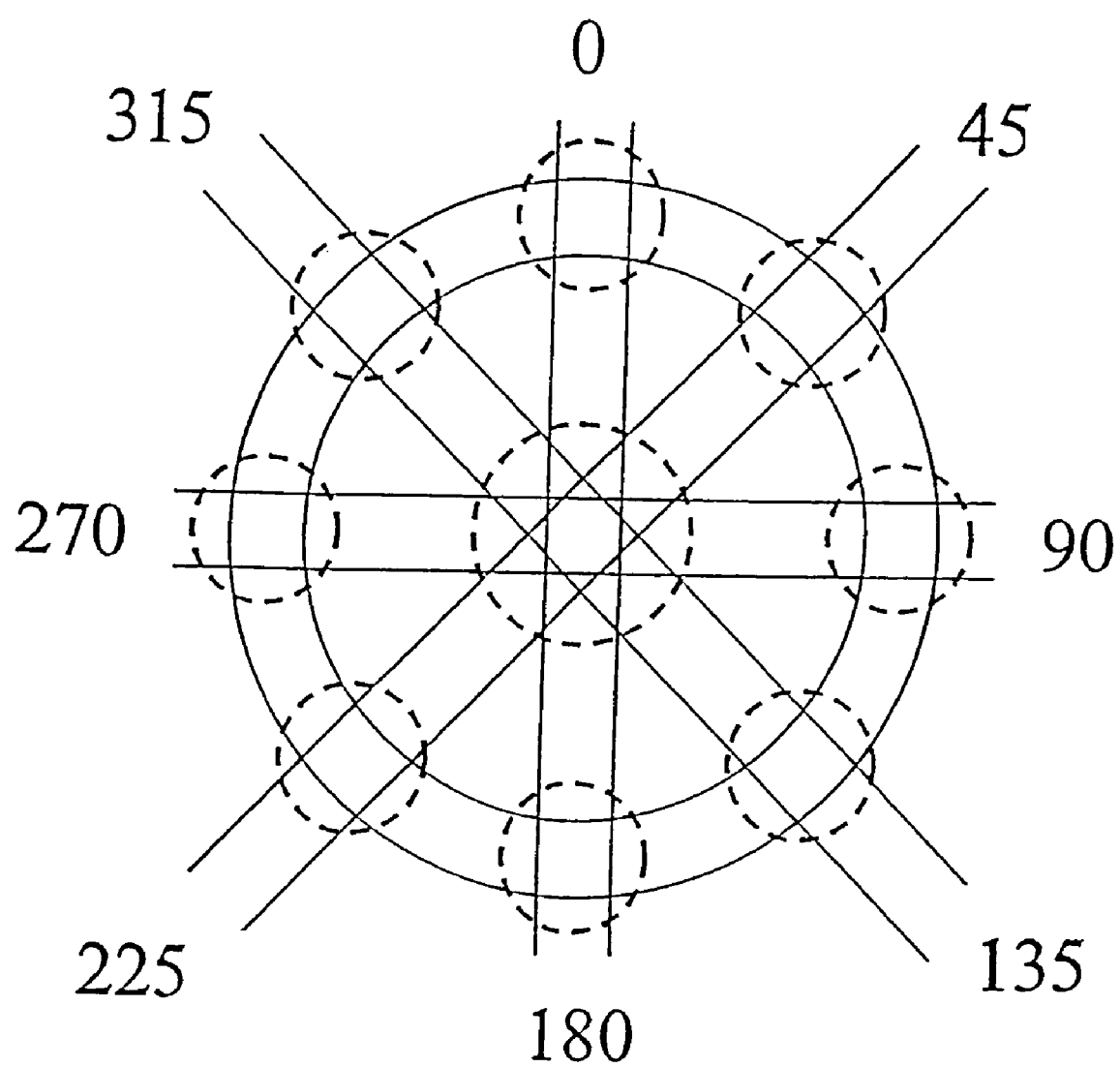
FIG. 7 is a open phase test target with pairs of phase zones oriented at 0, 45, 90, and 180 degrees.

A preferred embodiment of the invention is shown in FIG. 7. In this embodiment, a test target is designed as a grouping of phase zones so that the test target is a single open figure based on this collection of zones. The test target is referred to as a Wheel Aberration Target. The phase of the zones are shifted with respect to the phase of the surrounding field by 180 degrees. The features are sized in ranges between 0.5 and 1.5 lambda/NA and the entire open phase test target is between 2.5 and 5 lambda/NA in size. The interrelationships between the geometry is unique for each region within the test target as each portion has a unique proximity to surrounding phase values. These unique proximity conditions for regions in the target of FIG. 7 are described below.

| Region of target | Feature size | Neighborhood |
|---|---|---|
| Center | L3 | Features sized L1 spaced L2 at 0, 45, 90, 135, 180, 225, 270, and 315 degrees |

-continued

| Region of target | Feature size | Neighborhood |
|---|---|---|
| Top | L2 | Feature sized L3 spaced L2 below |
| | | Feature sized L2 at 315 and 45 degrees |
| Bottom | L2 | Feature sized L3 spaced L2 above |
| | | Feature sized L2 at 225 and 135 degrees |
| Right | L2 | Feature sized L3 spaced L2 to left |
| | | Feature sized L2 at 45 and 135 degrees |
| Left | L2 | Feature sized L3 spaced L2 to right |
| | | Feature sized L2 at 315 and 225 degrees |
| Top-Right | L2 | Feature sized L3 spaced L2 below-left |
| | | Feature sized L2 at 0 and 90 degrees |
| Top-Left | L2 | Feature sized L3 spaced L2 below-right |
| | | Feature sized L2 at 0 and 270 degrees |
| Bottom-Right | L2 | Feature sized L3 spaced L2 above-left |
| | | Feature sized L2 at 180 and 90 degrees |
| Bottom-Left | L2 | Feature sized L3 spaced L2 above-right |
| | | Feature sized L2 at 180 and 270 degrees |

Figure 8:
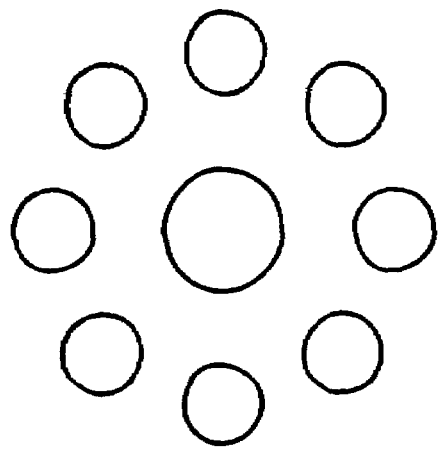
FIG. 8 shows variations of open phase test targets using circular and square shaped components.
Figure 8:
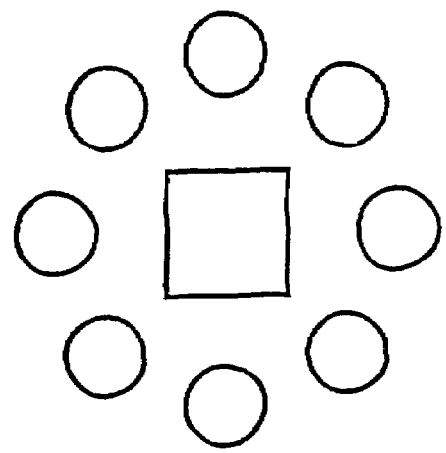
Figure 8:
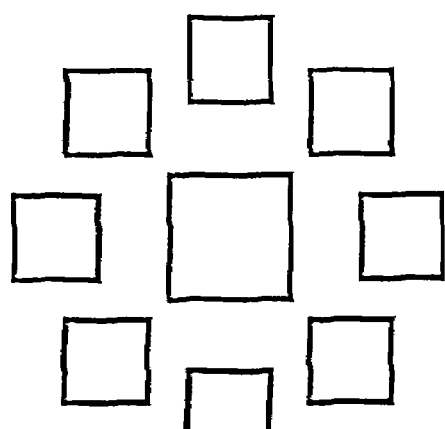
Figure 8:
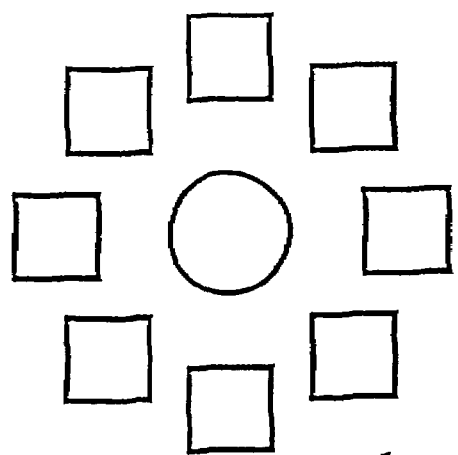

These multiple zones of the test object form a single figure with no closed form. This open phase nature of the test target is a unique and significant benefit of the invention. Unlike a closed figure having a phase structure that is designed so that all regions around the structure are identical regardless of azimuthal position, each location of the multiple feature open phase target of the invention is unique. Furthermore, the test structure of the present invention can take on forms different than that shown in FIG. 7. Examples of test targets with nine phase features are shown in FIG. 8. These targets consist of groupings of square and circular phase features of various sizing and shaping. The shape of the features within the target is less critical than the sizing and spacing since the detailed structure of the features is likely beyond the resolution of the lithography system. The transmission of the zones can be varied. In one embodiment, the transmission of all zones and all surrounding regions is unity. In another embodiment of the invention, the center zone has a transmission of zero. In each circumstance, the response of the zones within the test object to lens aberration are interrelated and the zones respond uniquely to specific aberrations depending on their location within the figure. Also, the grouping of the features is not limited to this descriptive example. Variations in the number of features, shaping, sizing, phase, transmission, and density can be modified with the same open phase test target effect where the interrelationship among the phase features allows for the unique detection of aberrations.

Figure 9:
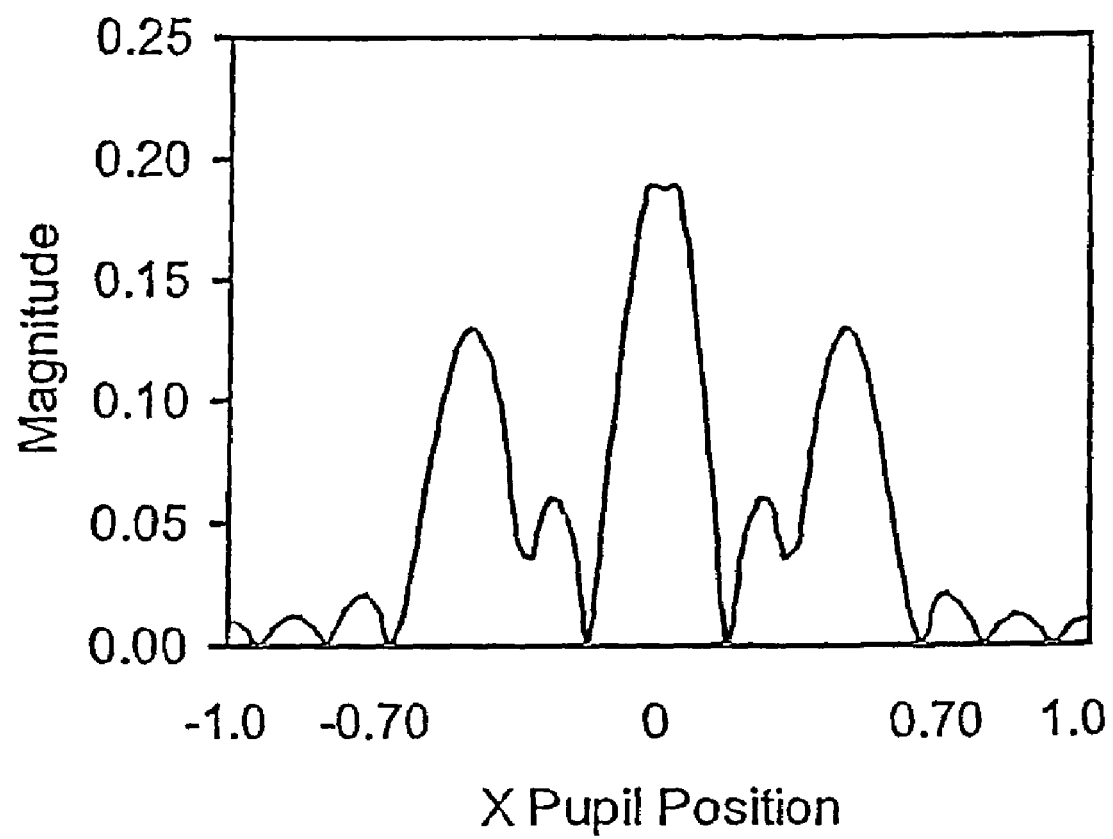
FIG. 9 is a plot of the diffraction energy within an objective lens pupil for a test target having L1=200 nm, L2=200 nm, and L3=200 nm.
Figure 10:
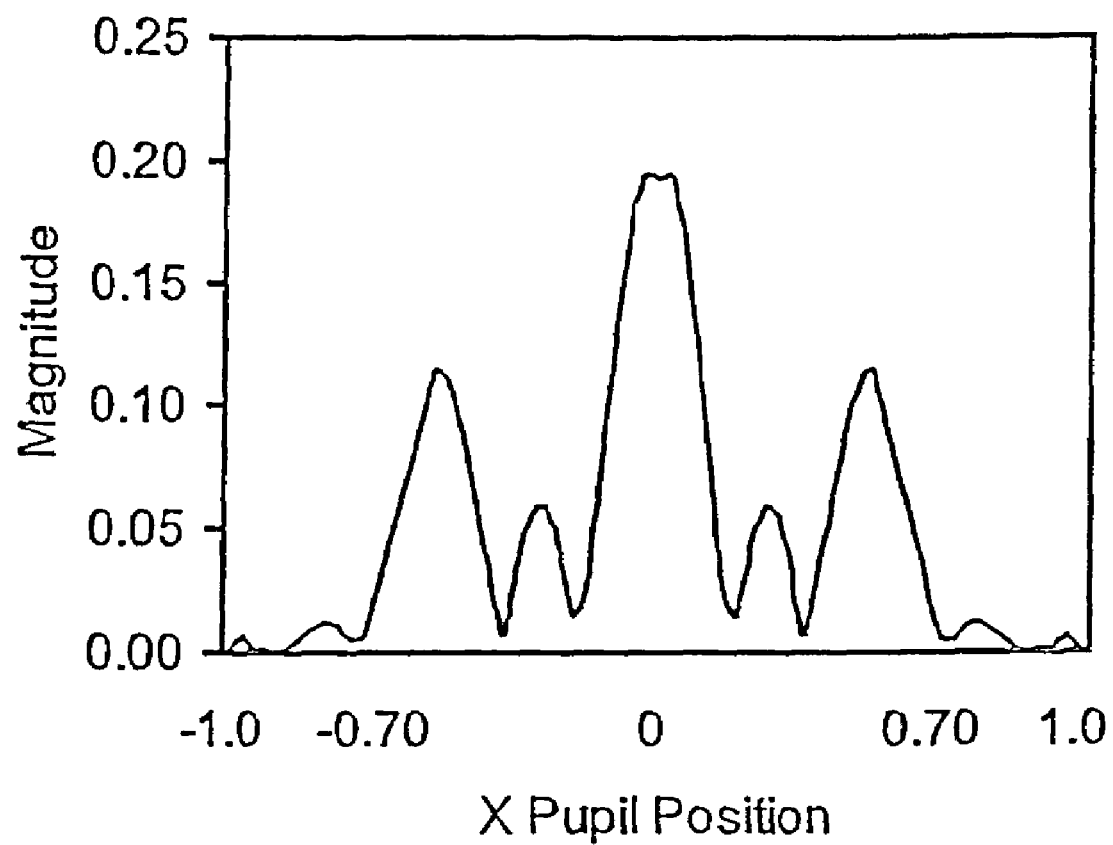
FIG. 10 is a plot of the diffraction energy within an objective lens pupil for a test target having L1=200 nm, L2=150 nm, and L3=200 nm.
Figure 11:
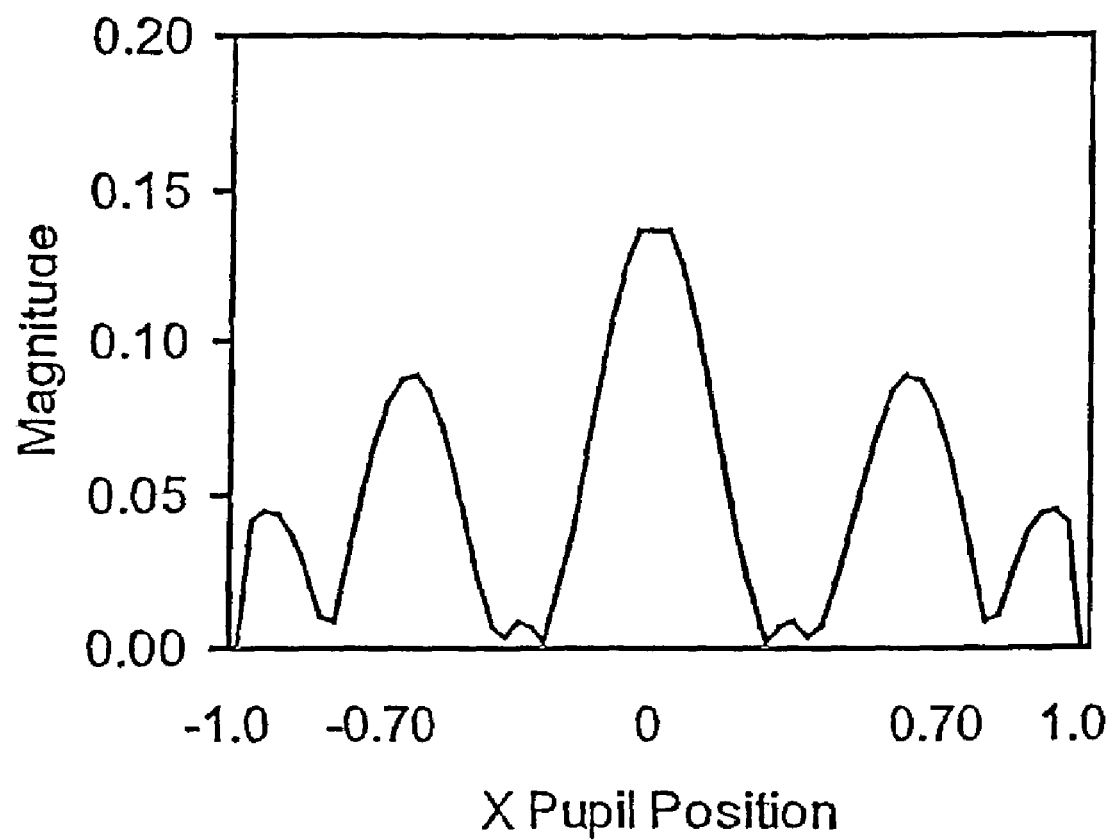
FIG. 11 is a plot of the diffraction energy within an objective lens pupil for a test target having L1=200 nm, L2=150 nm, and L3=100 nm.
Figure 12:
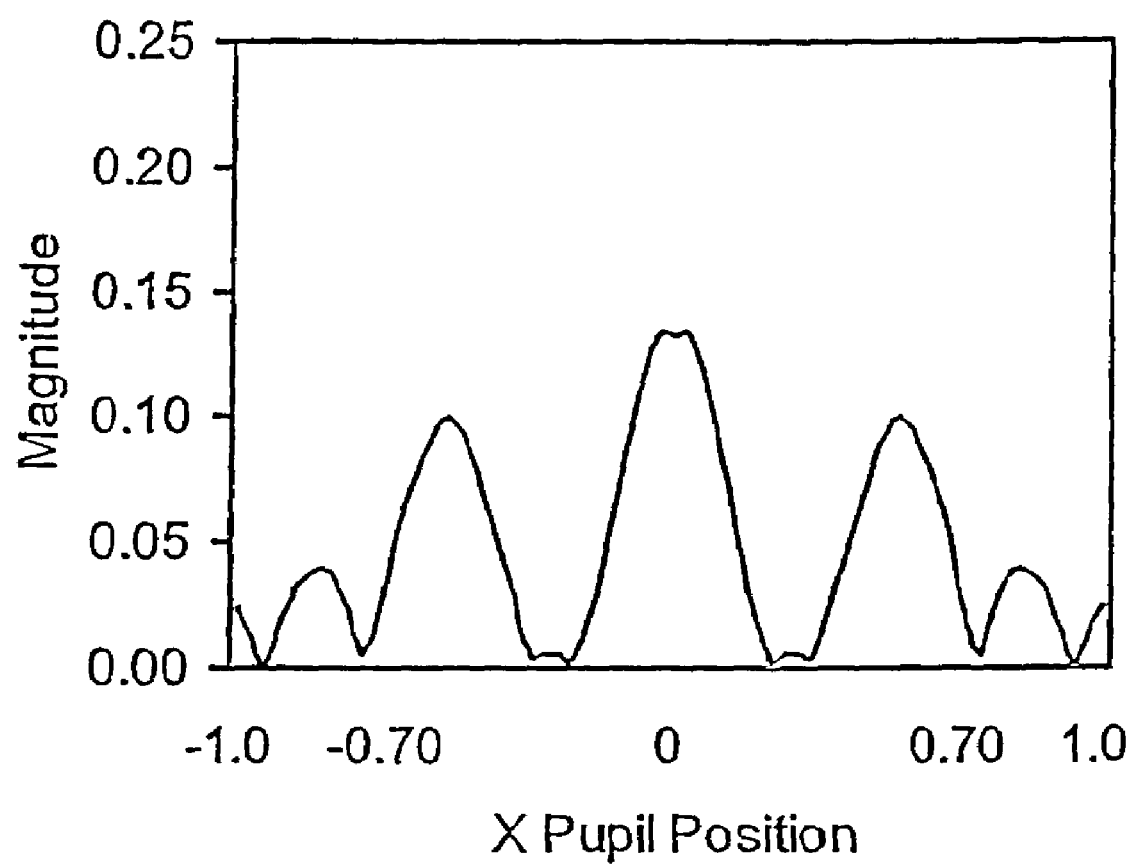
FIG. 12 is a plot of the diffraction energy within an objective lens pupil for a test target having L1=200 nm, L2=200 nm, and L3=100 nm.

Aberrations influence imaging through the deformation that they produce in a wavefront within a lens pupil. Consequently, it is desirable to design an aberration test target so that it will sample a lens pupil in the most beneficial fashion. Since aberrations have unique character in the manner which they influence specific portions of a lens pupil, the test target of the present invention can be designed so that it is most sensitive to particular aberration types and order. As an example, FIG. 9 shows the magnitude of the diffraction energy within the objective lens pupil for a test object comprising zones with sizing values corresponding to L3=200 nm, L2=200 nm, and L1=200 nm for a 157 nm wavelength imaging system operating at a numerical aperture of 0.85. FIG. 10 shows the magnitude of the diffraction in the objective lens pupil for a test object comprising zones with sizing values corresponding to L3=200 nm, L2=150 nm, and L1=200 nm for a 157 nm wavelength imaging system operating at a numerical aperture of 0.85. FIG. 11 shows the magnitude of the diffraction in the objective lens pupil for a test object comprising zones with sizing values corresponding to L3=200 nm, L2=150 nm, and L1=100 nm for a 157 nm wavelength imaging system operating at a numerical aperture of 0.85. FIG. 12 shows the magnitude of the diffraction in the objective lens pupil for a test object comprising zones with sizing values corresponding to L3=200 nm, L2=200 nm, and L1=100 nm for a 157 nm wavelength imaging system operating at a numerical aperture of 0.85. The distribution of the diffraction energy within a lens pupil is unique for each example and shows how a test object can be designed for particular sensitivity to an aberration order. The diffraction energy distribution of FIG. 11 for example is most sensitive to $3^{rd}$ order (or primary) aberration and the sizing values of this example are used for the remaining examples of the present description.

FIGS. 13 through 21 show simulated resist images from a test object with one open figure which comprises a multiple component array of phase zones, where sizing dimensions correspond to L3=200 nm, L2=150 nm, and L1=100 nm for a wavelength of 157 nm and a numerical aperture of 0.85. The zones within the figure are circular. The phase of the circular regions are phase shifted from the surrounding region by 180 degrees. The transmission of the figure is unity.

Figure 13:
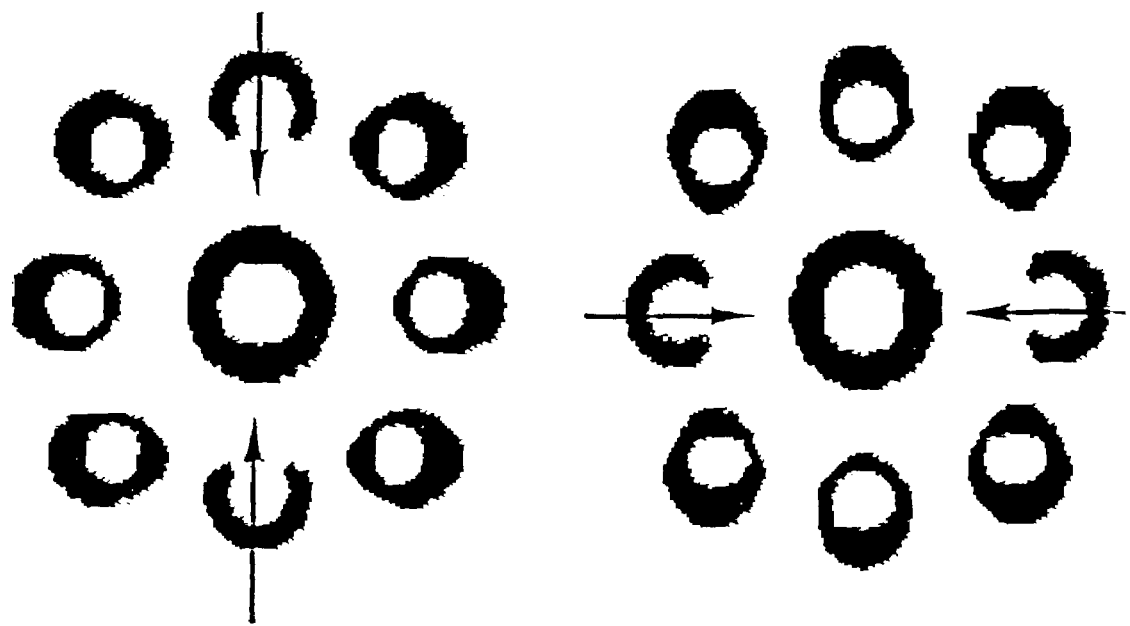
FIG. 13 is a resist image of an open phase test target showing the effects of negative astigmatism.

FIG. 13 shows the unique impact of negative $3^{rd}$ order astigmatism through a defocus range of +/−0.12 microns. The unique behavior of the images resulting from the method of the invention is the characteristic deformation of the images printed from the zones within the test target at X and Y orientations. In the presence of negative astigmatism, positive defocus causes the opening of the zones at the extreme Y locations. In the presence of negative astigmatism, negative defocus causes the opening of the zones at the extreme X locations.

Figure 14:
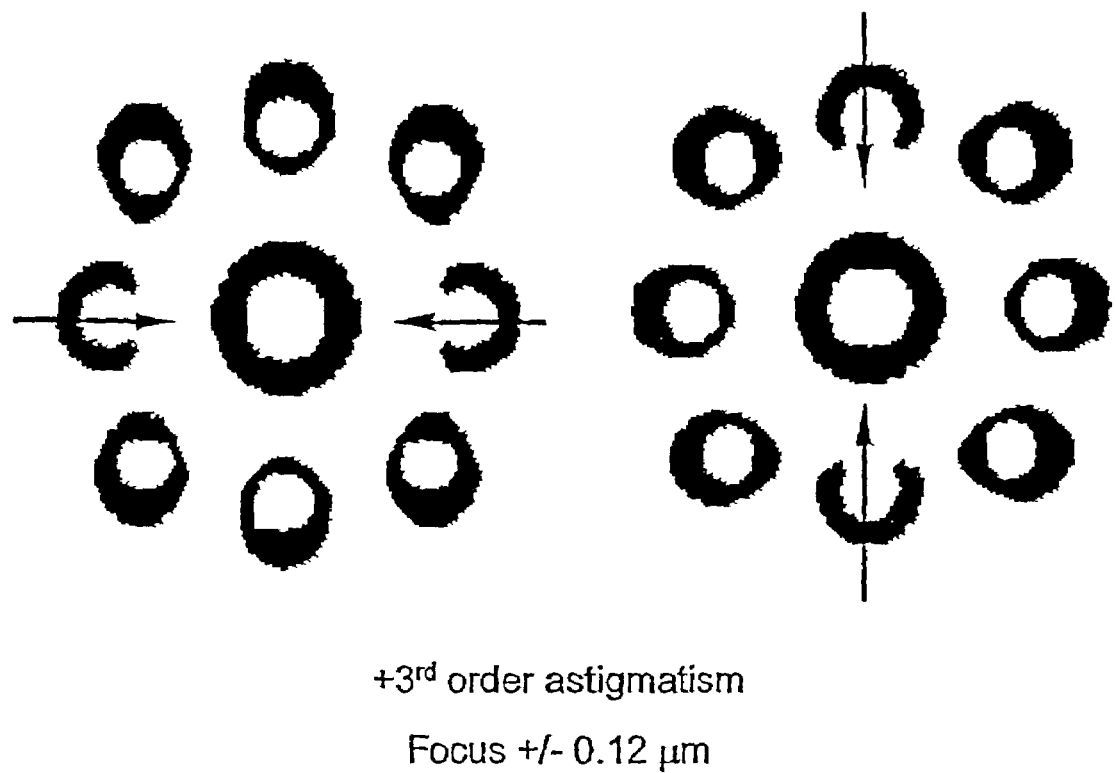
FIG. 14 is a resist image of an open phase test target showing the effects of positive astigmatism.

FIG. 14 shows the unique impact of positive $3^{rd}$ order astigmatism through a defocus range of +/−0.12 microns. The unique behavior of the images resulting from the method of the invention is the characteristic deformation of the images printed from the zones within the test target at X and Y orientations. In the presence of positive astigmatism, positive defocus causes the opening of the zones at the extreme X locations. In the presence of positive astigmatism, negative defocus causes the opening of the zones at the extreme Y locations.

Figure 15:
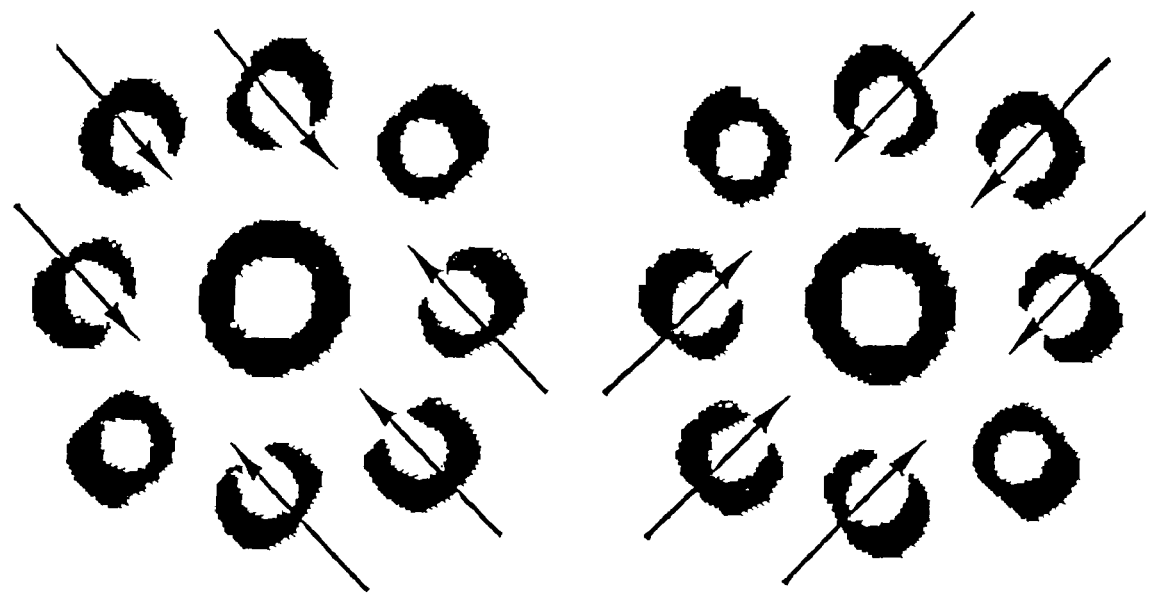
FIG. 15 is a resist image of an open phase test target showing the effects of positive 45 degree astigmatism.

FIG. 15 shows the unique impact of positive $3^{rd}$ order 45 degree astigmatism through a defocus range of +/−0.12 microns. The unique behavior of the images resulting from the method of the invention is the characteristic deformation of the images printed from the zones within the test target at diagonal orientations. In the presence of positive 45 degree astigmatism, positive defocus causes the opening of the zones at the extreme −45 degree locations. Negative defocus causes the opening of the zones at the extreme +45 degree locations.

Figure 16:
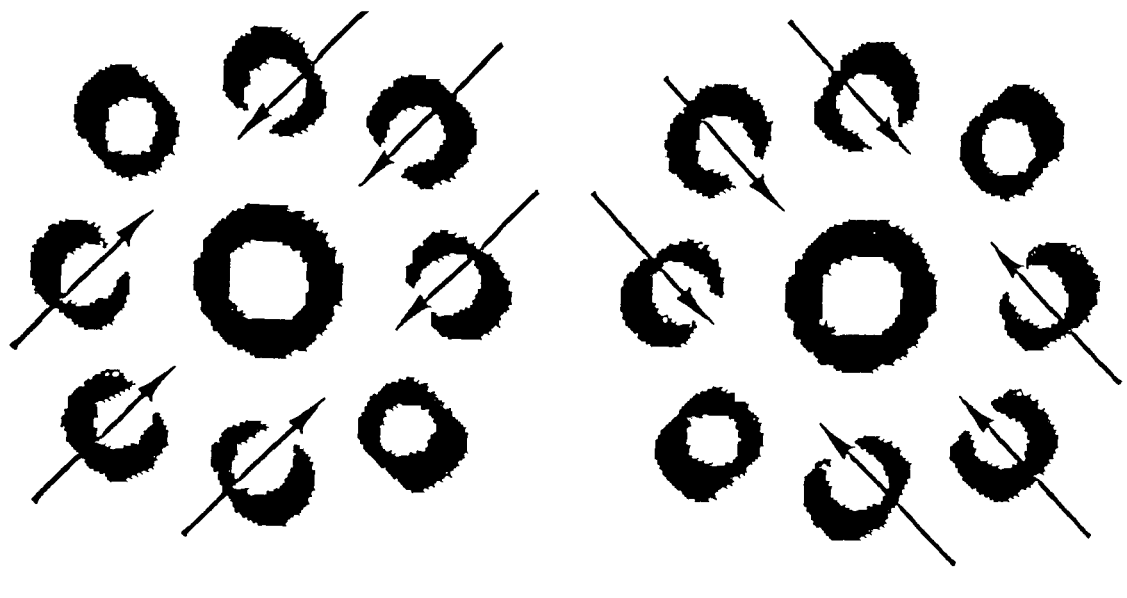
FIG. 16 is a resist image of an open phase test target showing the effects of negative 45 degree astigmatism.

FIG. 16 shows the unique impact of negative $3^{rd}$ order 45 degree astigmatism through a defocus range of +/−0.12 microns. The unique behavior of the images resulting from the method of the invention is the characteristic deformation of the images printed from the zones within the test target at diagonal orientations. In the presence of negative 45 degree astigmatism, positive defocus causes the opening of the zones at the extreme +45 degree locations. Negative defocus causes the opening of the zones at the extreme −45 degree locations.

Figure 17:
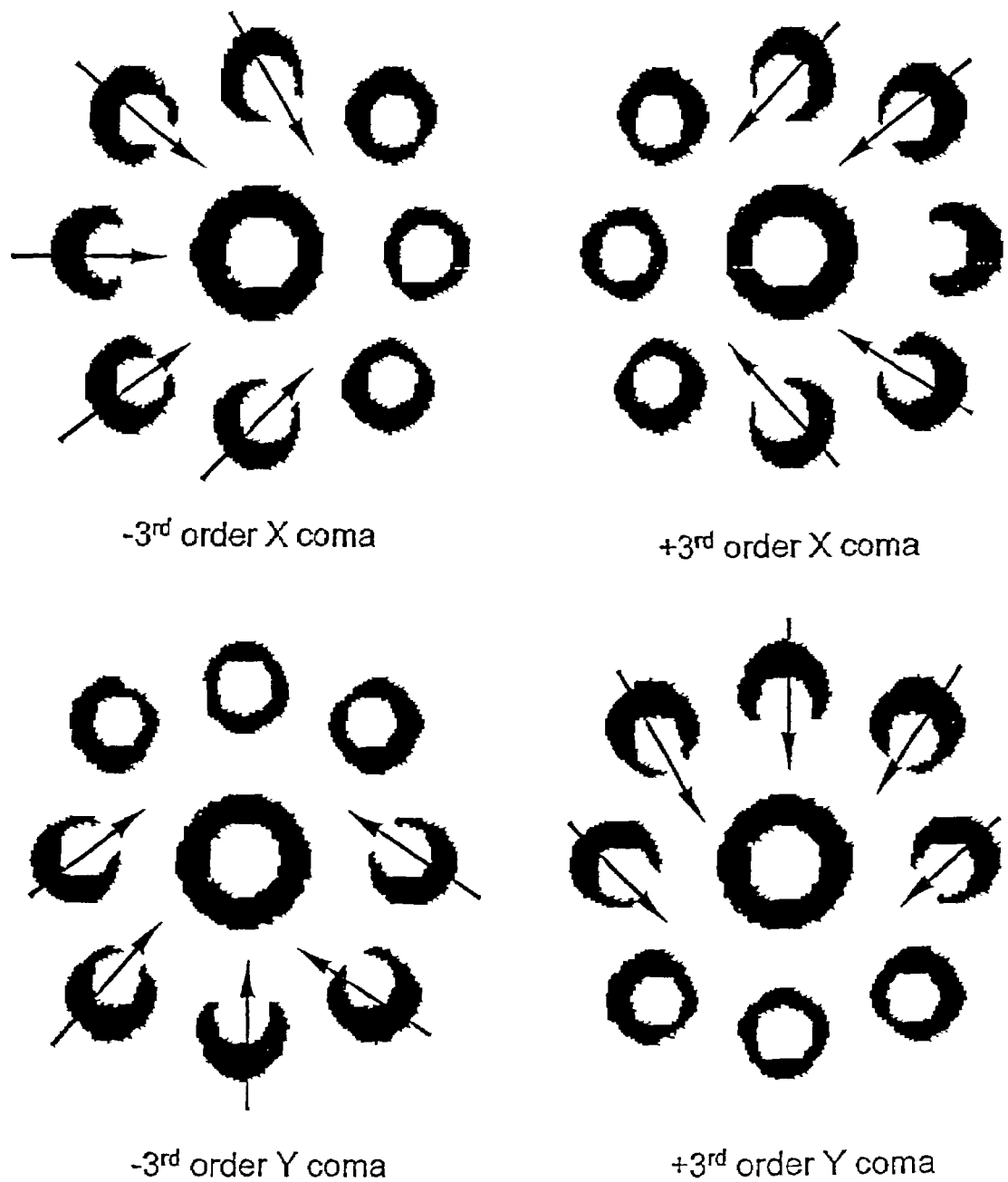
FIG. 17 is a resist image of an open phase test target showing the effects of coma.

FIG. 17 shows the unique impact of $3^{rd}$ order coma. The unique behavior of the images resulting from the method of the invention is the characteristic deformation of the images printed from the zones within the test target at all orientations. Coma aberration leads to the characteristic deformation of the images printed from the zones within the test target so that the zones are opened and oriented toward a point corresponding to the coma aberration. The outermost zone along the direction of the coma aberration, and opposite in sign, remains closed. Vectors can be drawn from the openings within the zones, which directed opposite in sign along the direction of the coma aberration, converging to a point at the edge of the target.

Figure 18:
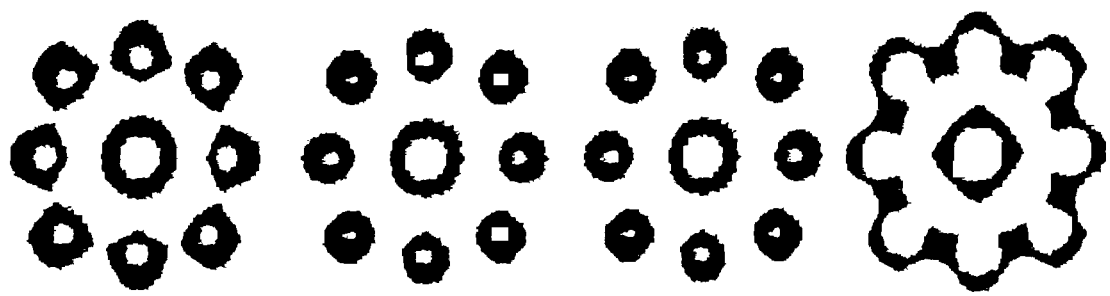
FIG. 18 is a resist image of an open phase test target showing the effects of spherical.
Figure 18:
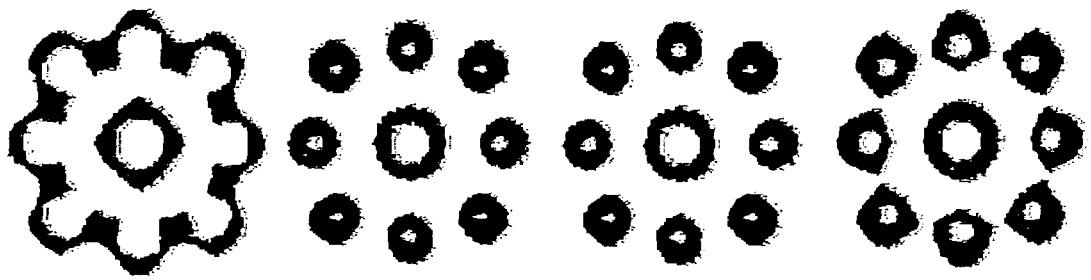

FIG. 18 shows the unique impact of spherical aberration. Spherical aberration causes a distinct expansion and contraction of the zones within the target. The effects are symmetrical within the target, which is an indication of the symmetrical nature of spherical aberration. The figure shows the effect of defocus values of −0.16, 0.12, +0.12, and +0.16 microns of defocus for negative and positive aberration.

Figure 19:
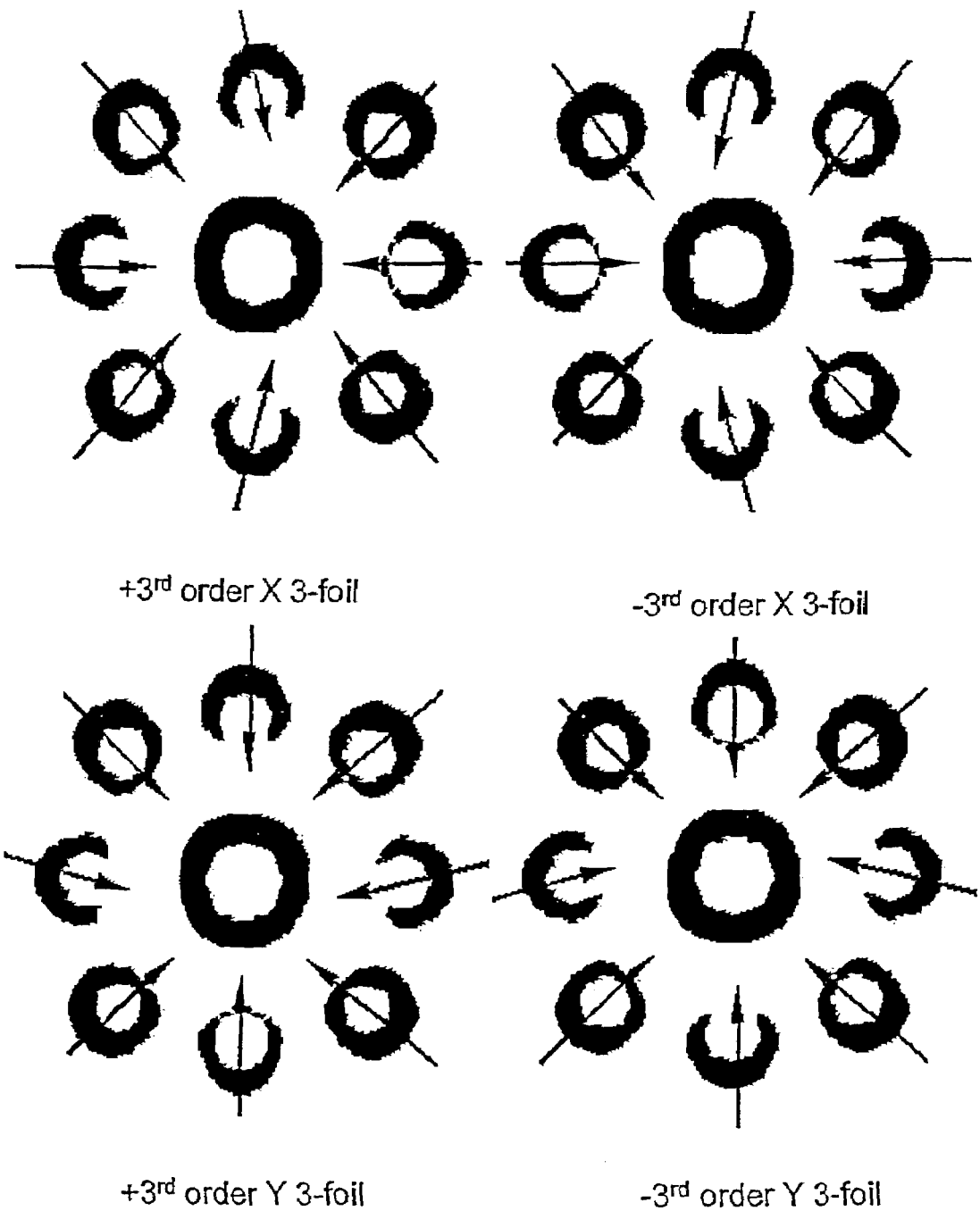
FIG. 19 is a resist image of an open phase test target showing the effects of three-foil.

FIG. 19 shows the unique impact of $3^{rd}$ order 3-point aberration. The unique behavior of the images resulting from the method of the invention is the characteristic deformation of the images printed from the zones within the test target at all orientations. 3-point aberration leads to the characteristic deformation of the images printed from the zones within the test target so that the zones are opened and oriented toward a point corresponding unique to the 3-point aberration. Vectors can be drawn from the openings within the zones, which directed opposite in sign along the direction of the 3-point aberration, converging to a point within the target. Unlike the coma aberration effects, the influence of 3-point is a deformation of all zones and a convergence of vectors corresponding to a 120 degree symmetry of the aberration.

Figure 20:
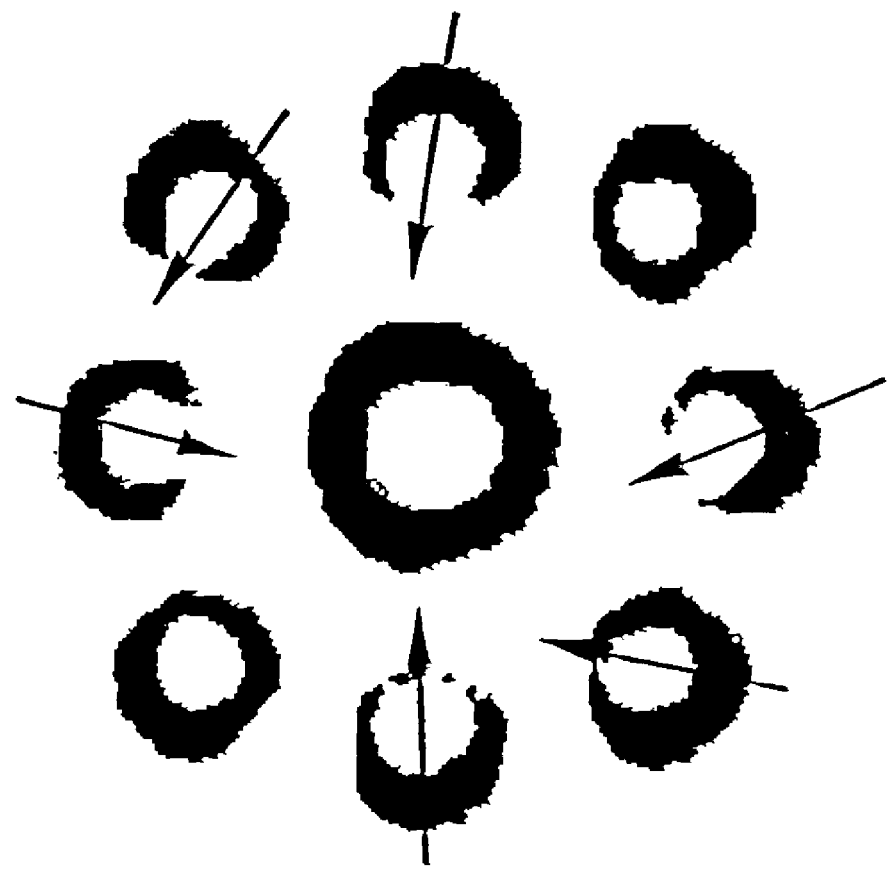
FIG. 20 is a resist image of an open phase test target showing the effects of multiple aberrations resulting in a total wavefront OPD of 0.035 waves RMS with 0.10 microns of defocus.

FIG. 20 is a simulated resist image of an open phase test target showing the effects of multiple aberrations. The effects of coma, astigmatism, spherical, and 3-point aberration combine to produce combined deformation effects on the zones of the test target. The total wavefront aberration in this example is 0.03waves (RMS). The contribution from primary aberrations is: −0.0025 waves of astigmatism, 0.0091 waves of 45 degree astigmatism, −0.0093 waves of x-coma, 0.0227 waves of y-coma, −0.0207 waves of spherical, −0.0676 waves of 3-point, and 0.0422 waves of 45 degree 3-point.

Figure 21:
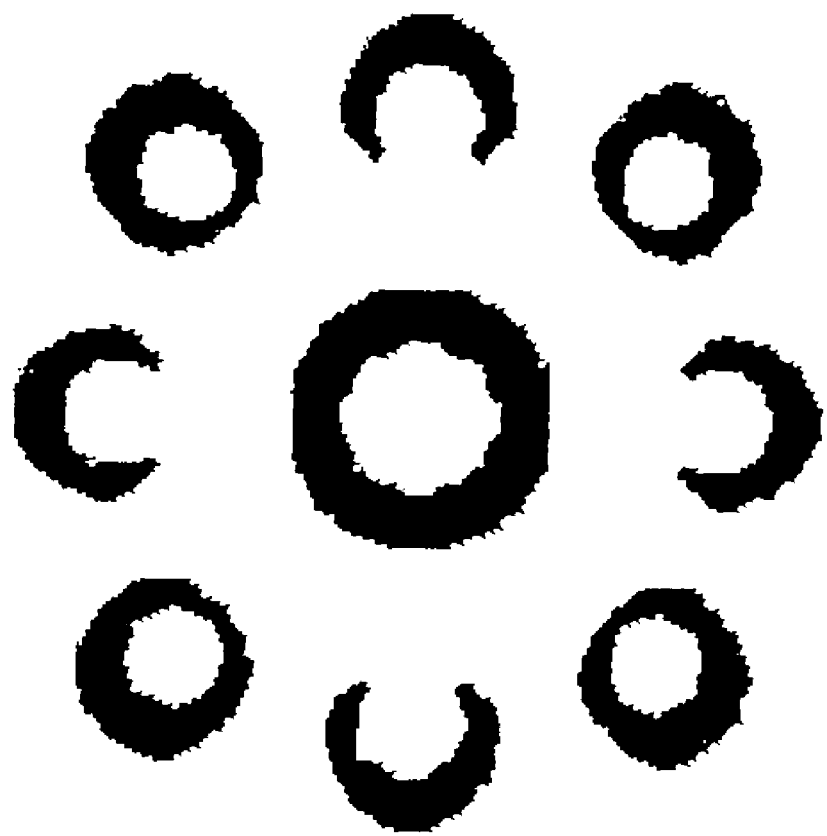
FIG. 21 is a resist image of an open phase test target showing the effects of no aberration.

FIG. 21 is a simulated resist image of an open phase test target showing the effects of no aberration. The zones within the test target open to a central region of the target.

Figure 22:
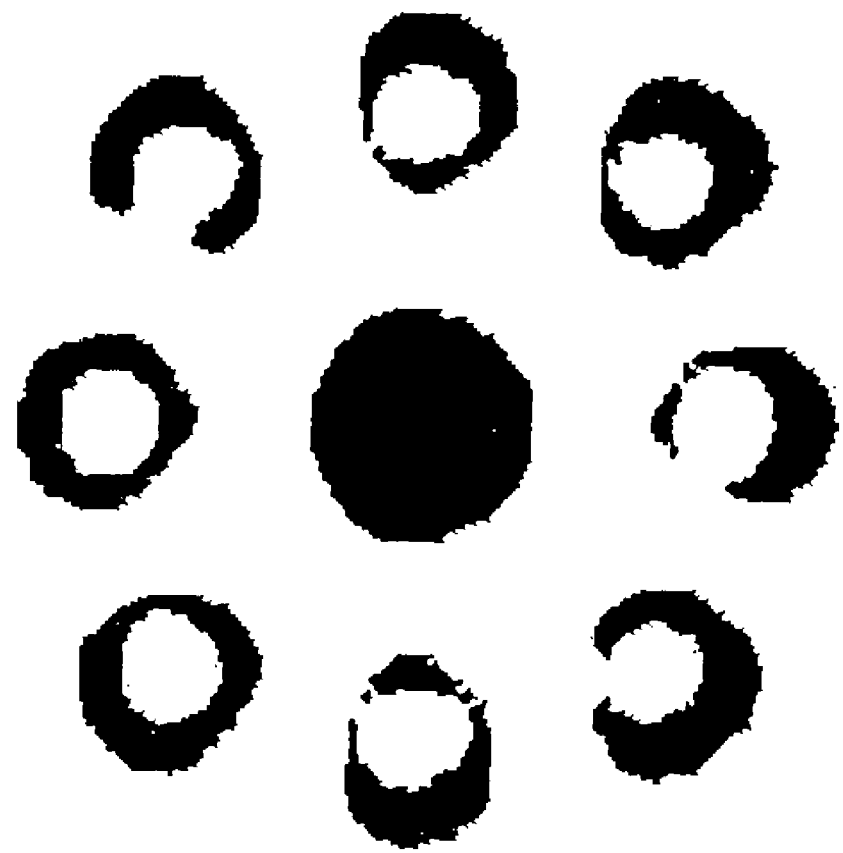
FIG. 22 is a resist image of a test target which has a central zone intensity of zero.

FIG. 22 is a resist image of a test target which has a central zone intensity of zero showing the effects of the multiple aberrations. The effects of coma, astigmatism, spherical, and 3-point aberration combine to produce combined deformation effects on the zones of the test target similar to the previous examples where the central zone intensity is unity.

The test object of the present invention is achieved as a photomask which is fabricated using methods that are common to phase-shift photomask fabrication. The steps involved in the fabrication of the mask include the layout of the test object using computer aided design of other methods, exposing a sensitized polymer film coated over a quartz plate which may also have a masking film, developing the exposed image, and transferring the image into the photomask using a dry or wet pattern transfer process. The phase shift within the regions of the test object are created through the etching of the quartz substrate to a depth corresponding to 180 degrees, with possible depth correction incorporated to account for phase effects of the relief structure of the mask. Alternative methods can be employed with the same effect, including the deposition of layers to achieve phase definition. Transmission of the test object can be controlled through patterning of the masking layer.

It should be particularly noted that the reference (substantially aberration free) image is produced or created through lithographic modeling and simulation. Aberrations are added to the simulation to allow for fitting by comparison of the simulated result to the result imaged via lithography. An iterative process is carried out where convergence to the lens aberration is achieved by comparison of the simulated result to the lithographic result. Alternatively, other methods of fitting the simulated result to the lithographic result can be used, such as, for example, mathematical fitting of shape parameters to the imaged target by polynomial fitting of curved edges, fitting parameters to target openings, fitting parameters to sizing and/or shifting results, to converge on an aberration level that would have resulted in such pattern deformation.

It should also be particularly noted that the analysis of the lithographic test image is performed by using a magnifying device. More particularly, the device is preferably scanned by a scanning detection device, such as, for example, a scanning electron microscope. The scanning detection device preferably coverts the scanned image into image data, which is then processed and displayed in a meaningful way, such as, for example, in graphs or diagrams, or is used to display actual visual images of the observed structures on a display device, such as a monitor.

The present invention is a method to detect and measure aberrations in an optical system using a test target in the object plane of a projection system and imaging a photoresist film with the system. The invention is described above but it is to be understood that it is not limited to these descriptive examples. The numerical values, structures, sizes, orientations, position, placement, and the like may be changed to accommodate specific imaging conditions. The design, optimization, and analysis methods for the invention can be incorporated into a lithographic simulator, a design layout tool, a computer program, or other analysis tools.

The invention claimed is:

1. A test target comprising:
   at least one open figure, including a multiple component array of phase zones, wherein:
   the phase zones are resolvable by an optical system;
   are arranged within the open figure so that their responses to lens aberrations are interrelated; and
   the zones respond uniquely to specific aberrations depending on their location within the figure.

2. The test target of claim 1 wherein the multiple component array of phase zones comprises a central phase zone and a plurality of circumferential phase zones.

3. The test target of claim 1 wherein there are at lest two phase zones and one is larger than the other.

4. The test target of claim 1 wherein the circumferential phase zones features are disposed at equal radial locations from the central phase zone and and are equally angularly spaced from each other.

5. The test target of claim 1 wherein there are at least eight circumferential phase zones.

6. The test target of claim 5 wherein the eight cirumferential phase zones are located at 0, 45, 90, 135, 180, 225, 270, and 315 degrees with respect to the central phase zone.

7. The test target of claim 1 having at least two circumferential phase zones spaced 180 degrees apart from each other for detecting positive or negative astigmatism.

8. The test target of claim 7 having at least two more circumferential phase zones spaced 180 apart from each other and 90 degrees from the first two circumfertial phase zones for detecting positive and negative astigmatism.

9. The test target of claim 1 having at least four circumferential phase zones located at 0, 90, 180, 270 dgreees and two more phase zones at 135 and 315 degrees or 45 and 225 degrees to detect 45 degree astigmatism.

10. The test target of claim 9 wherein the phase zones have the same or different shapes.

11. The test target of claim 9 wherein the phase zones have circular or rectangular shapes.

12. The test target of claim 9 wherein the phase zones have the same shape.

13. The test target of claim 9 wherein the central phase zone has one shape and the circumferential phase zones have a different shape.

14. The test target of claim 1 wherein the size of the phase zones and the spaces between the phase zones are between $0.5\lambda/NA$ to $1.5\lambda/NA$ where $\lambda$ is the wavelenght of the light exposing the target and NA is the numerical aperture of the exposure system.

15. The test target of claim 1 wherein the size of the target is between $2.5\lambda/NA$ to $5.0\lambda/NA$ where $\lambda$ is the wavelength of the light exposing the target and NA is the numerical aperture of the exposure system.

16. The test target of claim 1 wherein the phase zones are 180 degrees out of phase with respect to the rest of the target.

17. The test target of claim 1 wherein the phase zones are etched into the surface of the target.

* * * * *